(12) United States Patent
Chen et al.

(10) Patent No.: US 12,238,934 B2
(45) Date of Patent: Feb. 25, 2025

(54) METHOD OF FABRICATING SEMICONDUCTOR DEVICE COMPRISING FERROELECTRIC LAYER

(71) Applicant: TAIWAN SEMICONDUCTOR MANUFACTURING COMPANY, LTD., Hsinchu (TW)

(72) Inventors: Tzu-Yu Chen, Kaohsiung (TW); Hsin-Yu Lai, Hsinchu (TW); Sheng-Hung Shih, Hsinchu (TW); Fu-Chen Chang, New Taipei (TW); Kuo-Chi Tu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 129 days.

(21) Appl. No.: 17/461,736

(22) Filed: Aug. 30, 2021

(65) Prior Publication Data

US 2023/0065132 A1    Mar. 2, 2023

(51) Int. Cl.
*H10B 53/00* (2023.01)
*H01L 49/02* (2006.01)

(52) U.S. Cl.
CPC ............ *H10B 53/00* (2023.02); *H01L 28/40* (2013.01)

(58) Field of Classification Search
CPC ......... H10B 53/00; H10B 53/30; H01L 28/40; H01L 28/60; H01L 21/02189; H01L 21/02266; H01L 21/02181; H01L 28/55; C23C 14/16; C23C 16/405
See application file for complete search history.

(56) References Cited

U.S. PATENT DOCUMENTS

| | | | | |
|---|---|---|---|---|
| 6,153,898 | A  * | 11/2000 | Watanabe | H01L 28/56 257/295 |
| 6,383,821 | B1 * | 5/2002 | Young | H01L 23/485 257/E21.585 |
| 2005/0181600 | A1 * | 8/2005 | Lee | H01L 21/2855 438/653 |
| 2008/0191252 | A1 * | 8/2008 | Nakamura | H10B 53/30 257/295 |
| 2008/0311683 | A1 * | 12/2008 | Wang | C23C 16/56 257/E21.208 |
| 2008/0311711 | A1 * | 12/2008 | Hampp | H01L 21/76814 257/E21.409 |
| 2012/0235299 | A1 * | 9/2012 | Chang | H01L 23/53238 438/653 |
| 2015/0380635 | A1 * | 12/2015 | Srinivasan | H10N 30/85 204/192.18 |
| 2021/0358931 | A1 * | 11/2021 | Makala | H01L 29/78391 |

* cited by examiner

*Primary Examiner* — Nelson Garces
(74) *Attorney, Agent, or Firm* — Maschoff Brennan

(57) ABSTRACT

A method for fabricating a semiconductor device is provided. The method includes depositing a ferroelectric layer over the substrate; performing a first ionized physical deposition process to deposit a top electrode layer over the ferroelectric layer; patterning the top electrode layer into a top electrode; and patterning the ferroelectric layer to into a ferroelectric element below the top electrode.

20 Claims, 24 Drawing Sheets

METHOD OF FABRICATING SEMICONDUCTOR DEVICE COMPRISING FERROELECTRIC LAYER

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
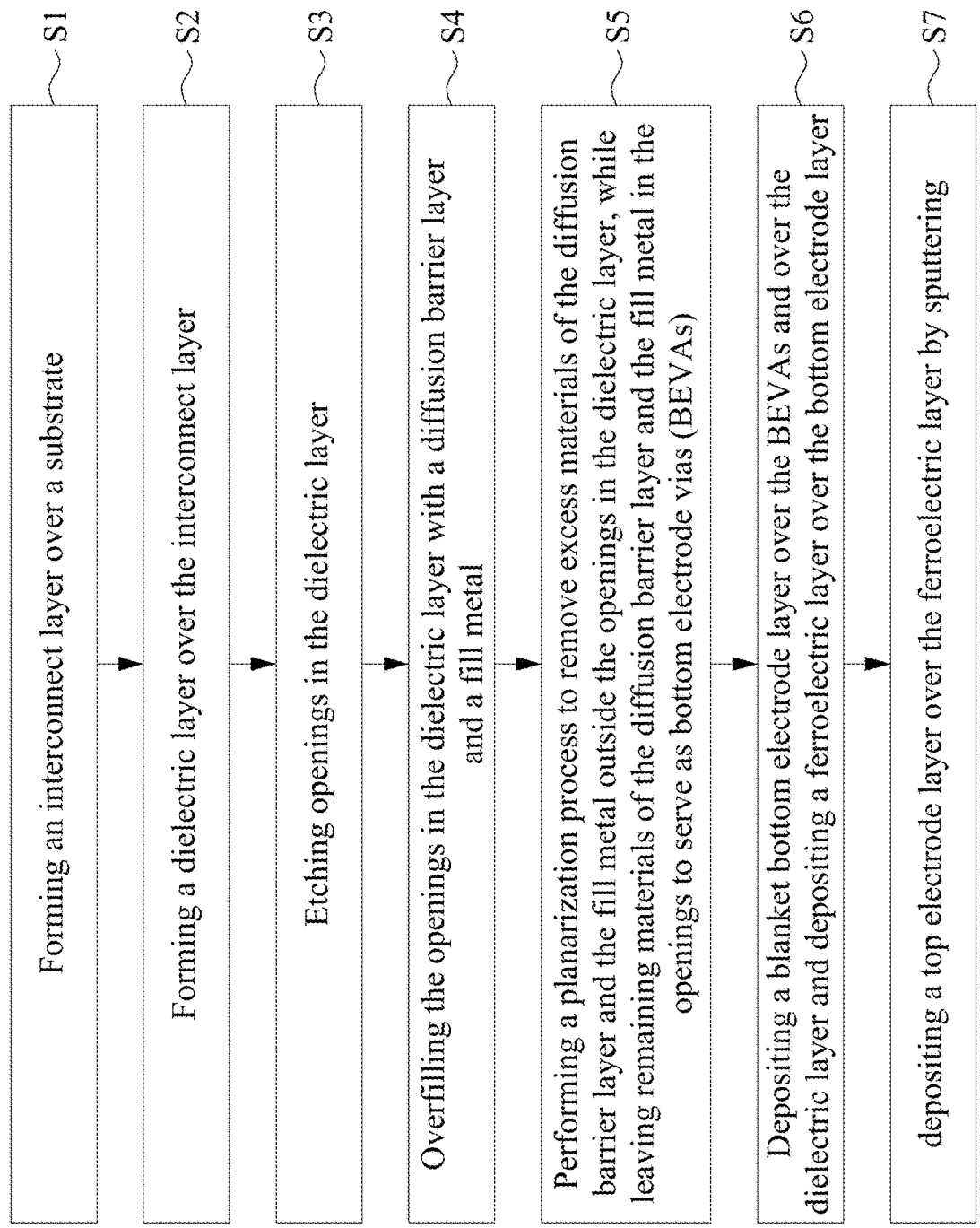
FIGS. 1A and 1B are flow charts of a method for fabricating an integrated circuit device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Ferroelectric random access memory (FeRAM) is a non-volatile memory, in which data are stored using hysteretic P-E (polarization vs. electric field) characteristics in a ferroelectric film. For example, ferroelectric materials in the ferroelectric film are electrically polarizable materials that possess at least two polarization states, which polarization states may be switched by the application of an external electric field. Each polarization state of ferroelectric materials remains stable even after the removal of the applied electric field for at least some period of time. Due to this stability of polarization states, ferroelectric materials have been used for memory applications. One of the polarization states is considered to be a logic "1" and the other state a logic "0." Ferroelectric materials have a non-linear relationship between the applied electric field and the apparent stored charge, resulting in a ferroelectric characteristic in the form of a hysteresis loop.

Ferroelectric materials, such as hafnium zirconium oxide (HZO), lead zirconate titanate (PZT), strontium bismuth tantalite (SBT), doped hafnium oxide (Si: HfO2), barium titanate (BaTiO3), hafnium oxide (HfO2), and zirconium oxide (ZrO2) are widely used in the ferroelectric film. The functional properties of these ferroelectric materials are linked to their crystal structures and phases. That is to say, ferro phase, which may relate to non-centrosymmetric and polar crystal structures, may demonstrate its ferroelectric behavior. For example, HZO in orthorhombic phase have a non-linear relationship/response between the applied electric field and the apparent stored charge, resulting in a ferroelectric characteristic in the form of a hysteresis loop. Through the design, the polarization states in the ferroelectric film of the FeRAM cell may determine data '0' and '1'.

However, other phases (called as non-ferro phase) that show little ferroelectric behavior may also exist in the ferroelectric materials. As the size of FeRAM cells degreases, the non-ferro phase may become occupying a large area in the FeRAM cells, which result in large variation in ferroelectric characteristic/response when FeRAM cells have a small area, which in turn will reduce the yield rate. That is, the small-area ferro phase may result in a small memory window in the fabrication process.

An integrated circuit device having the FeRAM cells and the method of fabricating the same are provided in accordance with various exemplary embodiments. The intermediate stages of forming the integrated circuit device are illustrated. The variations of the embodiments are discussed. Throughout the various views and illustrative embodiments, like reference numbers are used to designate like elements.

Figure 1B:
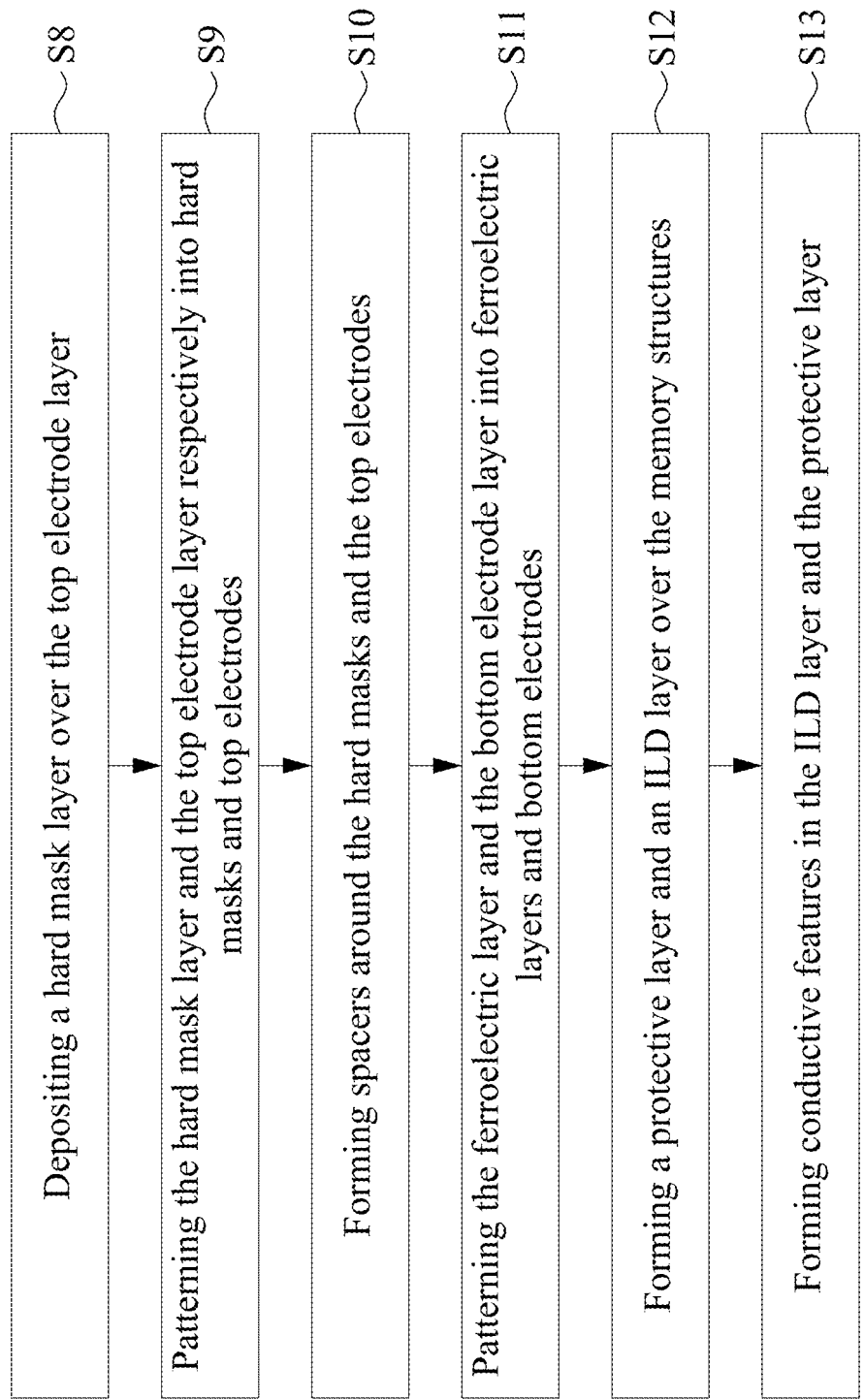

FIGS. 1A and 1B are flow charts of a method M for fabricating an integrated circuit device in accordance with some embodiments. FIGS. 2 through 14 illustrate an integrated circuit device having a memory cell at various stages of fabrication in accordance with some embodiments of the present disclosure. The method M includes forming an interconnect layer over a substrate; forming a dielectric layer over the interconnect layer; etching openings in the dielectric layer; overfilling the openings in the dielectric layer with a diffusion barrier layer and a fill metal; performing a planarization process to remove excess materials of the diffusion barrier layer and the fill metal outside the openings in the dielectric layer, while leaving remaining materials of the diffusion barrier layer and the fill metal in the openings to serve as bottom electrode vias (BEVAs); depositing a blanket bottom electrode layer over the BEVAs and over the dielectric layer and depositing a ferroelectric layer over the bottom electrode layer; depositing a top electrode layer over the ferroelectric layer by sputtering; depositing a hard mask layer over the top electrode layer; patterning the hard mask layer and the top electrode layer respectively into hard masks and top electrodes; forming spacers around the hard masks and the top electrodes; patterning the ferroelectric layer and the bottom electrode layer into ferroelectric layers and bottom electrodes; forming a protective layer and an ILD layer over the memory structures; and forming conductive features in the ILD layer and the protective layer. The illustration is merely exemplary and is not intended to limit beyond what is specifically recited in the claims that follow. It is understood that additional operations may be provided before, during, and after the operations S1-S13 shown by FIGS. 1A and 1B, and some of the operations S1-S13 described below can be replaced or eliminated for additional embodiments of the method. The order of the operations/processes may be interchangeable.

Figure 2:
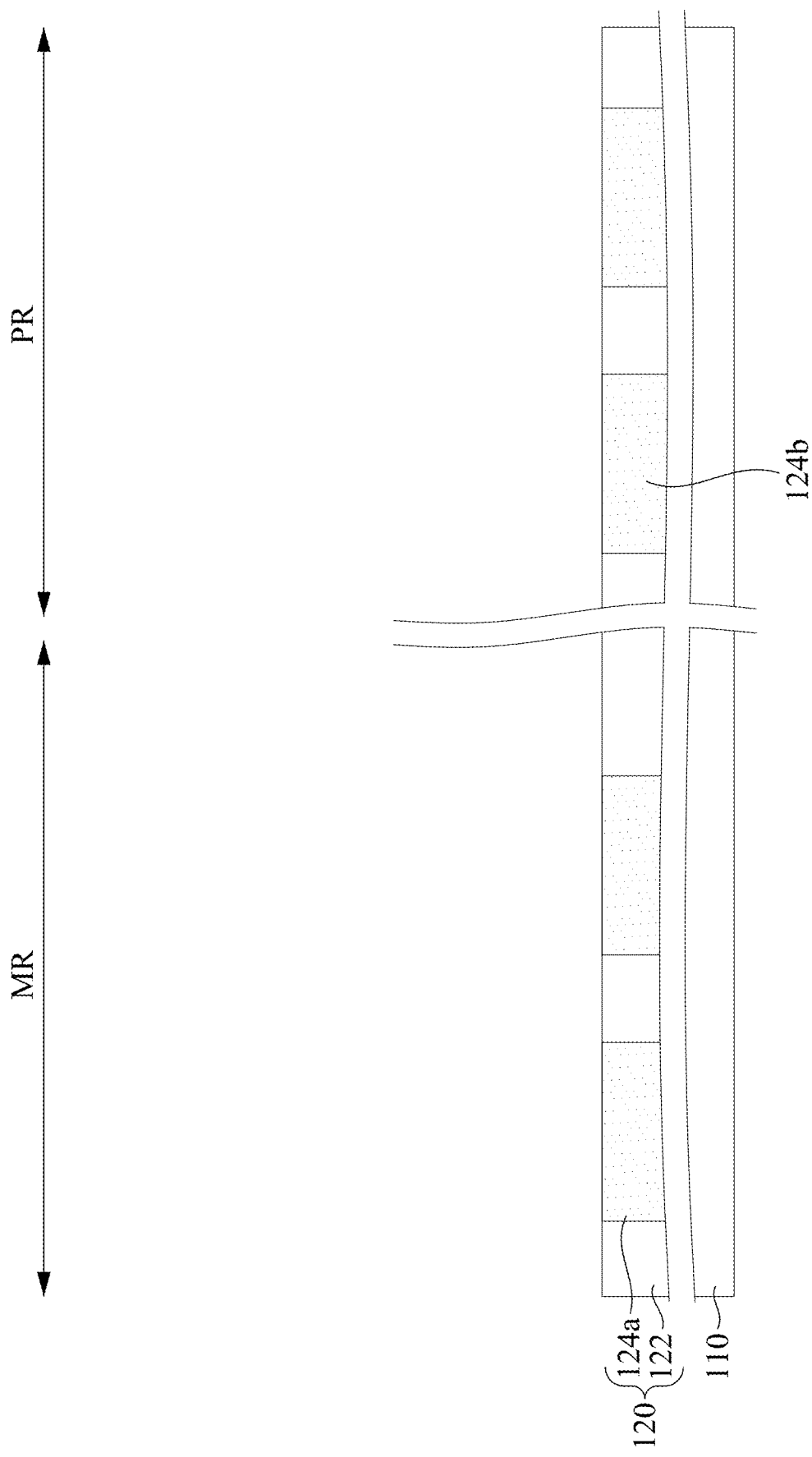
FIGS. 2 through 14 illustrate an integrated circuit device having a memory cell at various stages of fabrication in accordance with some embodiments of the present disclosure.

Referring to FIG. 1A and FIG. 2, the method M begins at operation S1 where one or more interconnect layers 120 are formed over a substrate 110. The substrate 110 has a peripheral region PR where logic devices or passive devices are to be formed, and a memory region MR where memory cells are to be formed. The substrate 110 may be a silicon substrate. Alternatively, the substrate 110 may comprise another elementary semiconductor, such as germanium; a compound semiconductor including silicon carbide; an alloy semiconductor including silicon germanium; or combinations thereof. In some embodiments, the substrate 110 is a semiconductor on insulator (SOI) substrate. The substrate may include doped regions, such as p-wells and n-wells. In the present embodiments, a wafer is a workpiece that includes a semiconductor substrate and various features formed in and over and attached to the semiconductor substrate. The wafer may be in various stages of fabrication and is processed using the CMOS process. The transistors are formed by suitable transistor fabrication processes and may be a planar transistor, such as polysilicon gate transistors or high-k metal gate transistors, or a multi-gate transistor, such as fin field effect transistors.

After the transistors are formed, one or more interconnect layers 120 of a multi-level interconnect (MLI) is formed over the transistors. The interconnect layer 120 includes one or more conductive features 124a and 124b embedded in inter-layer dielectric (ILD) layer 122. The ILD layer 122 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The conductive features 124a and 124b may be aluminum, aluminum alloy, copper, copper alloy, titanium, titanium nitride, tantalum, tantalum nitride, tungsten, cobalt, the like, and/or combinations thereof. Formation of the conductive features 124a and 124b and the ILD layer 122 may be a dual-damascene process and/or a single-damascene process. For example, trench openings are etched in the ILD layer 122, and then the conductive materials are deposited into the openings in the ILD layer 122 using CVD, PVD (e.g., sputtering deposition), ALD, the like, and/or the combination thereof. Subsequently, a portion of the conductive materials out of the openings in the ILD layer 122 are removed by suitable planarization process, such as a chemical-mechanical polish (CMP) process. The substrate 110 may also include active and passive devices, for example, underlying the interconnect layer 120. These further components are omitted from the figures for clarity.

Figure 3:
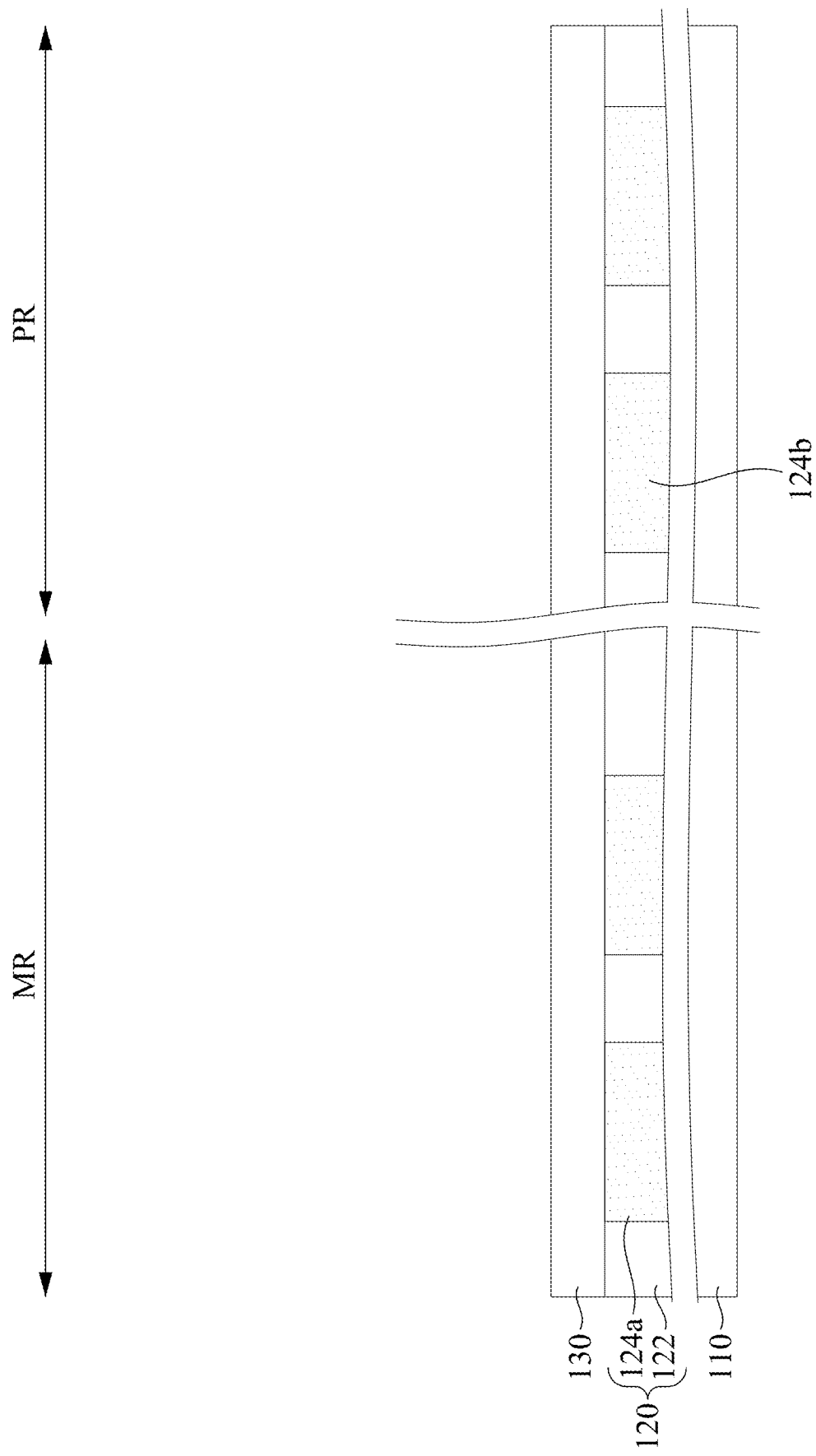

Referring to FIG. 1A and FIG. 3, the method M proceeds to operation S2 where a dielectric layer 130 is formed over the interconnect layer 120. The dielectric layer 130 in some embodiments is silicon carbide (SiC), silicon oxynitride (SiON), silicon nitride (SiN), silicon dioxide, the like, and/or combinations thereof. The dielectric layer 130 may be a single-layered structure or a multi-layered structure. The dielectric layer 130 may be formed by acceptable deposition techniques, such as chemical vapor deposition (CVD), atomic layer deposition (ALD), physical vapor deposition (PVD), the like, and/or the combination thereof.

Figure 4:
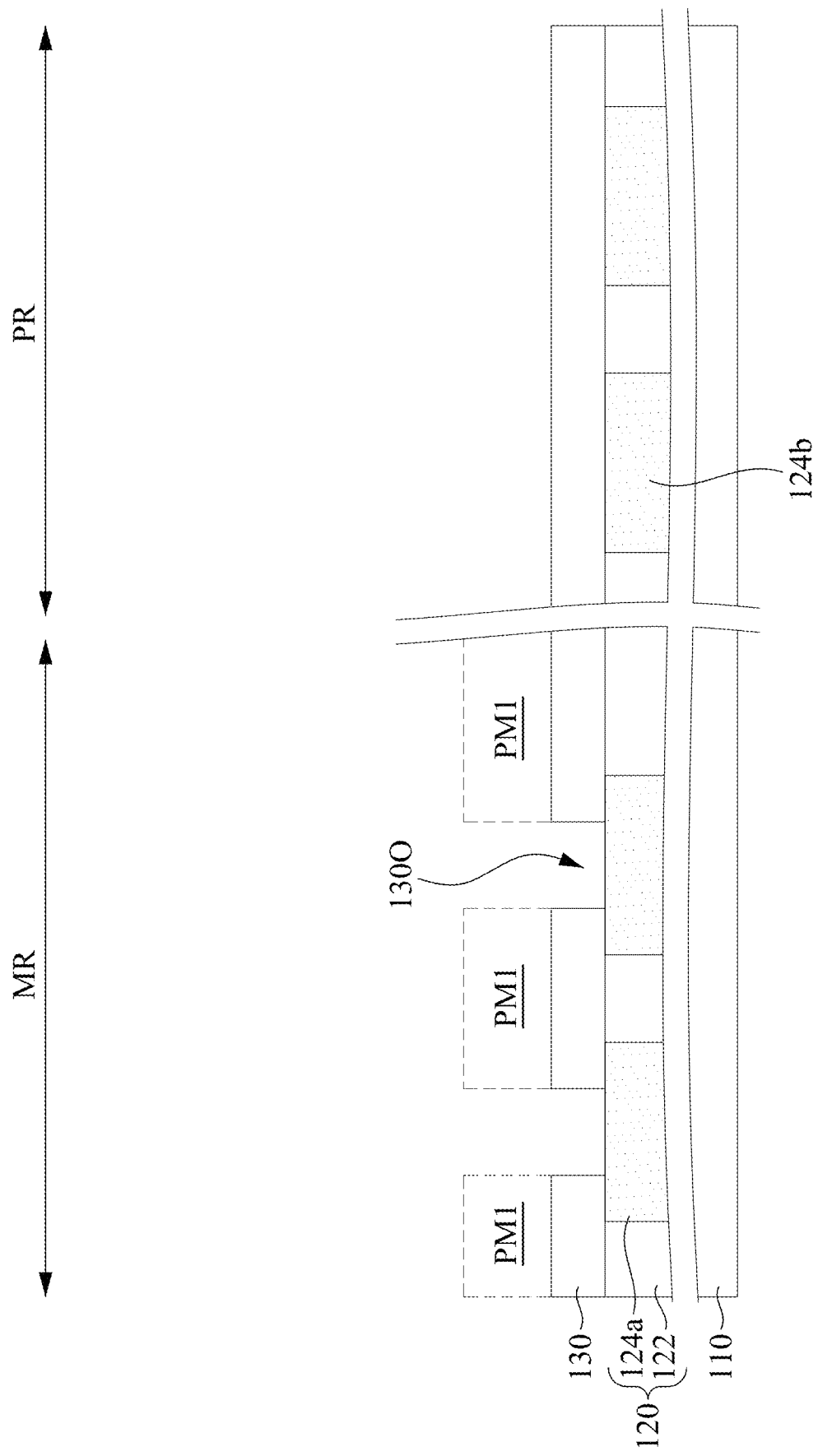

Reference is made to FIG. 1A and FIG. 4. The method M proceeds to operation S3 where the dielectric layer 130 is patterned to have openings 130O exposing portions of the conductive features 124a in the memory region MR. An exemplary formation method of the openings 130O includes forming a patterned resist layer PM1 over the dielectric layer 130, and then etching the dielectric layer 130 through the patterned resist layer PM1 by one or more etching processes.

For example, a resist layer is formed over the dielectric layer 130 (referring to FIG. 3) and patterned using suitable photolithography process, thereby forming the patterned resist layer PM1. For example, the process may include photoresist coating (e.g., spin-on coating), soft baking, mask aligning, exposure, post-exposure baking, developing the photoresist, rinsing, drying (e.g., hard baking), other suitable processes, or combinations thereof. In some embodiments, the patterned resist layer PM1 is an ashing removable dielectric (ARD), which is a photoresist-like material generally having the properties of a photoresist and amendable to etching and patterning like a photoresist. The patterned resist layer PM1 may also acts as a mask layer for etching or patterning underlying layers. In some embodiments, the patterned resist layer PM1 includes an organic material, such as polymer. In some embodiments, the patterned resist layer PM1 includes SiON. The patterned resist layer PM1 may be formed by spin-on coating, CVD, PVD, ALD, or other suitable processes.

Subsequently, an etching process is performed to etch the dielectric layer 130 (referring to FIG. 3), such that portions of the dielectric layer 130 (referring to FIG. 3) uncovered by the patterned resist layer PM1 are removed. The remaining portions of the dielectric layer 130 (referring to FIG. 3) has the openings 130O. The etching process may be a dry etch using suitable etchants. The conductive features 124a and the patterned resist layer PM1 may have a higher etch resistance to the etchants than that of the dielectric layer 130, thereby protecting underlying layers from being etched. After the etching process, the patterned resist layer PM1 may be removed by suitable etching process.

Figure 5:
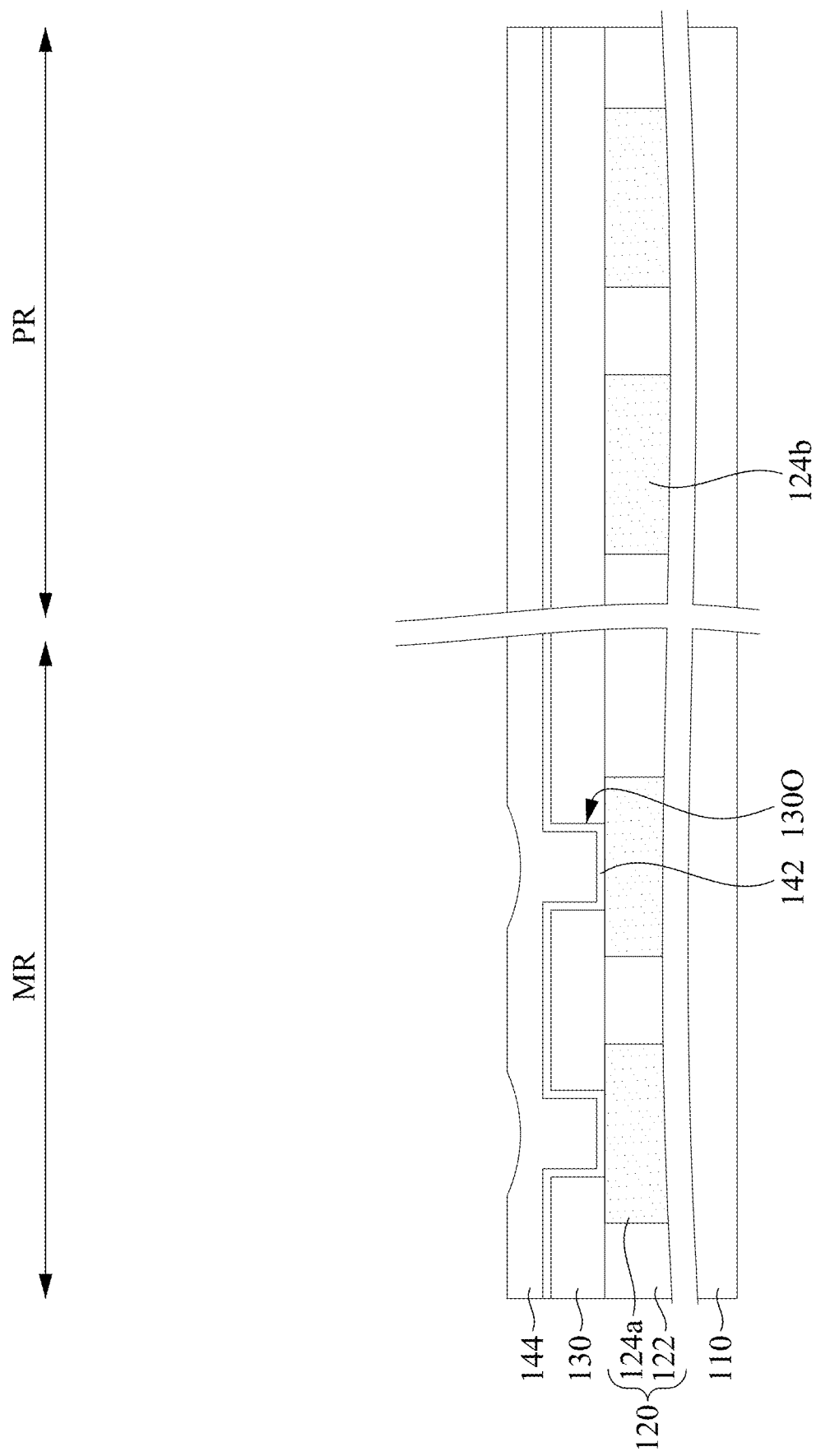

Reference is made to FIG. 1A and FIG. 5. The method M proceeds to operation S4 where the openings 130O in the dielectric layer 130 are overfilled with a diffusion barrier layer 142 and a fill metal 144. In some embodiments, the diffusion barrier layer 142 is a titanium nitride (TiN) layer or a tantalum nitride (TaN) layer, which can act as a suitable barrier to prevent metal diffusion. Formation of the diffusion barrier layer 142 may be exemplarily performed using CVD, PVD (e.g., sputtering deposition), ALD, the like, and/or the combination thereof. In some embodiments, the filling metal 144 is titanium (Ti), tantalum (Ta), platinum (Pt), ruthenium (Ru), tungsten (W), aluminum (Al), copper (Cu), TiN, TaN, the like, and/or combinations thereof. Formation of the filling metal 144 may be exemplarily performed using CVD, PVD (e.g., sputtering deposition), ALD, the like, and/or the combination thereof.

In some embodiments, for filling openings 130O, the barrier layer 142 and/or the filling metal 144 may be deposited by a PVD process with high directionality substantially normal to the substrate 110. In some other embodiments, the barrier layer 142 and/or the filling metal 144 may be deposited by a PVD process with low directionality substantially normal to the substrate 110.

Figure 6:
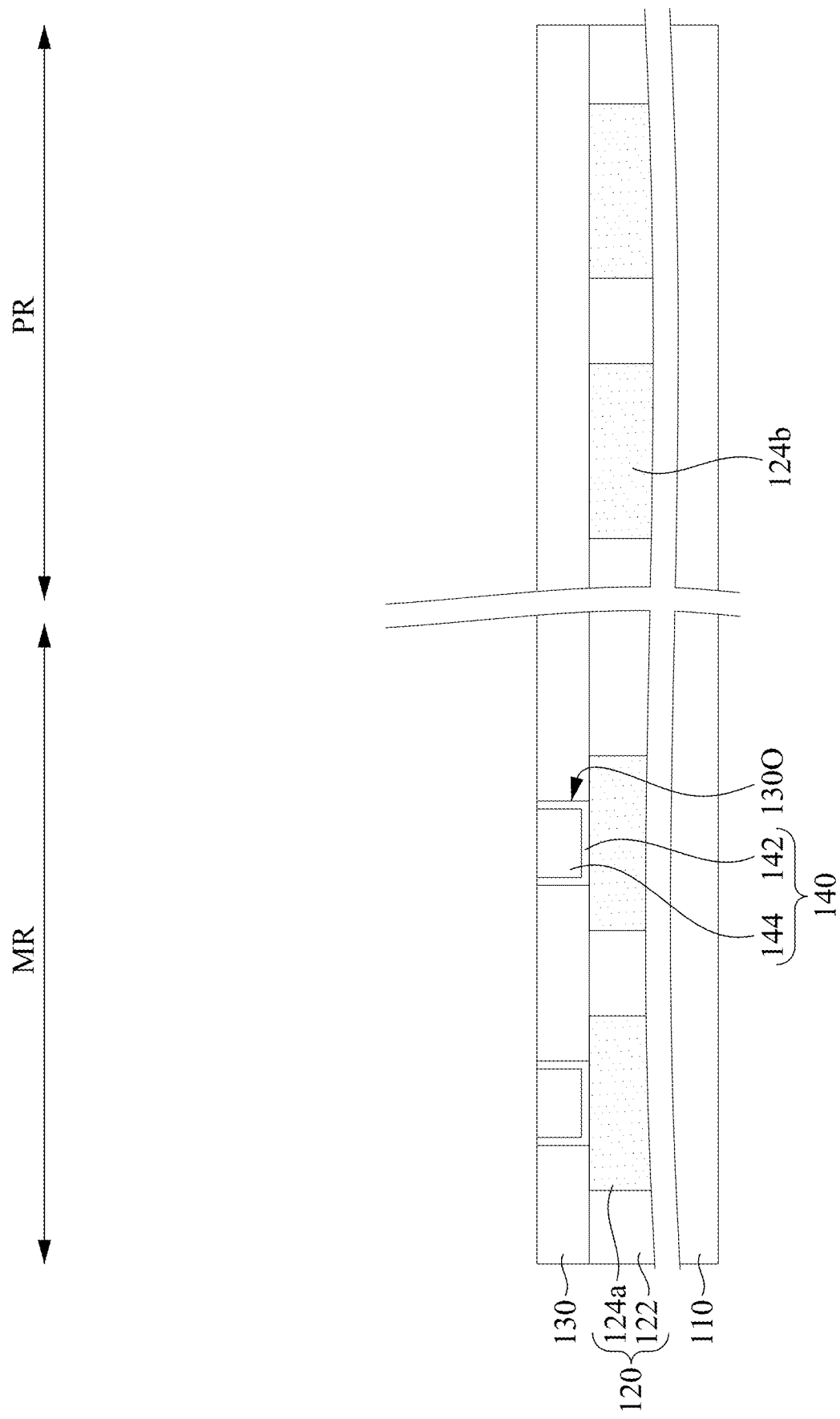

Reference is made to FIG. 1A and FIG. 6. The method M proceeds to operation S5 where a planarization process, such as a CMP process, is performed to remove excess materials of the diffusion barrier layer 142 and the fill metal 144 outside the openings 130O in the dielectric layer 130. The remaining diffusion barrier layer 142 and the remaining fill metal 144 in the openings 130O in the dielectric layer 130 can serve as the bottom electrode vias (BEVA) 140. In some embodiments, the BEVAs 140 are electrically connected to an underlying electrical component, such as a transistor, through the conductive features 124a.

Figure 7:
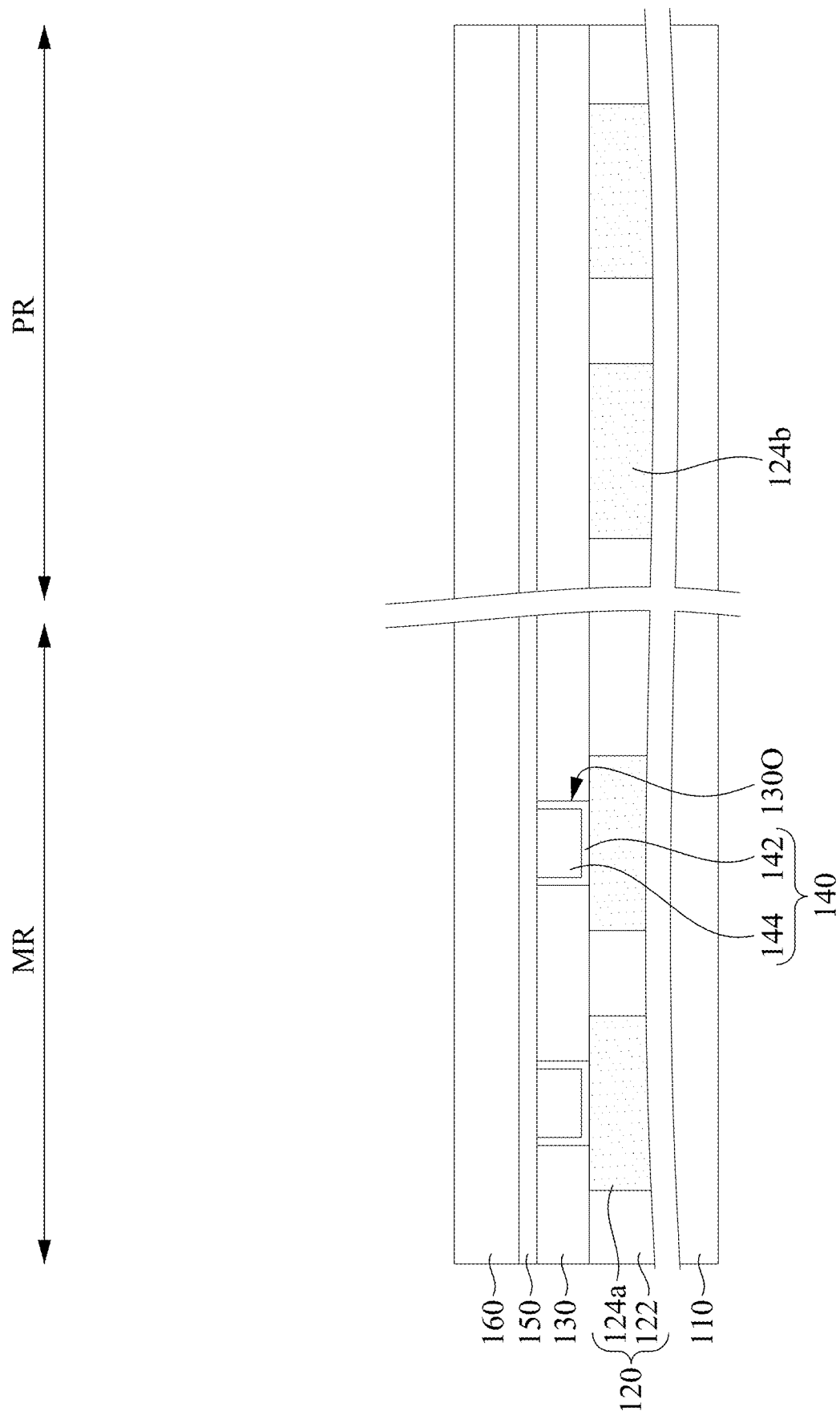

Reference is made to FIG. 1A and FIG. 7. The method M proceeds to operation S6 where a blanket bottom electrode layer 150 is depositing over the BEVAs 140 and over the dielectric layer 130, so that the bottom electrode layer 150 extends along top surfaces of the BEVAs 140 and of the dielectric layer 130. In some embodiments, the bottom electrode layer 150 may include titanium (Ti), tantalum (Ta), platinum (Pt), ruthenium (Ru), tungsten (W), aluminum (Al), copper (Cu), TiN, TaN, the like, and/or the combination thereof. The bottom electrode layer 150 can be a single-layered structure or a multi-layered structure. Formation of the bottom electrode layer 150 may be exemplarily performed using CVD, PVD (e.g., sputtering deposition), ALD, the like, and/or the combination thereof. In some other embodiments, the configuration of the BEVAs 140 can be omitted, and the bottom electrode layer 150 is deposited to be in contact with the conductive features 124a.

In some embodiments, the bottom electrode layer 150 may be deposited by a PVD process with high directionality substantially normal to the substrate 110. In some embodiments, the bottom electrode layer 150 may be deposited by a PVD process with low directionality substantially normal to the substrate 110, and a CMP process may be optionally performed on the bottom electrode layer 150 to improve to flatness of the top surface of the bottom electrode layer 150.

Subsequently, a ferroelectric layer 160 is deposited over the bottom electrode layer 150. In some embodiments, the ferroelectric layer 160 may include ferroelectric materials, such as hafnium zirconium oxide ($HfZrO_2$, HZO), lead zirconate titanate ($Pb(Zr,Ti)O_3$, PZT), strontium bismuth tantalite ($SrBi_2Ta_2O_9$, SBT), doped hafnium oxide (Si:$HfO_2$), barium titanate (BaTiO3, BTO), hafnium oxide ($HfO_2$), and zirconium oxide ($ZrO_2$). In some embodiments, the ferroelectric layer 160 may be hafnium oxide ($HfO_2$) doped with Zr, Si, Y, Al, Gd, La, or Sr. The ferroelectric layer 160 may be formed by atomic layer deposition (ALD), such as thermal ALD, and other suitable techniques.

In some embodiments, the ferroelectric layer 160 have plural different phases, some of these phases showing a ferroelectric characteristic (e.g., hysteretic P-E characteristic) are called ferro phase, while some of these phases showing little ferroelectric behavior are called non-ferro phase. The ferro phase may be related a centrosymmetric and polar crystal structure. For example, in some embodiments where the ferroelectric layer 160 includes HZO, the HZO may have monoclinic phase, tetra phase, and orthorhombic phase, in which the orthorhombic phase is the ferro phase of HZO, and the monoclinic phase and tetra phase are the non-ferro phase of HZO. For example, in some embodiments where the ferroelectric layer 160 includes $BaTiO_3$, the $BaTiO_3$ may have tetragonal phase, cubic phase, orthorhombic phase, and rhombohedral phase, in which the tetragonal, orthorhombic, and rhombohedral phase are the ferro phase of $BaTiO_3$, and the cubic phase is the non-ferro phase of $BaTiO_3$. For example, in some embodiments where the ferroelectric layer 160 includes PZT, the PZT may have tetragonal phase, cubic phase, orthorhombic phase, monoclinic phase, and rhombohedral phase, in which the tetragonal, orthorhombic, monoclinic, and rhombohedral phase are the ferro phase of PZT, and the cubic phase is the non-ferro phase of PZT. The amounts of the ferro and non-ferro phases of the ferroelectric layer 160 may be changed by recrystallization (e.g., heat annealing process) in subsequent processes, and can be observed in a finished product by suitable means, such as X-ray diffraction (XRD), electron backscatter diffraction (EBSD), or precession electron diffraction (PED).

Figure 8:
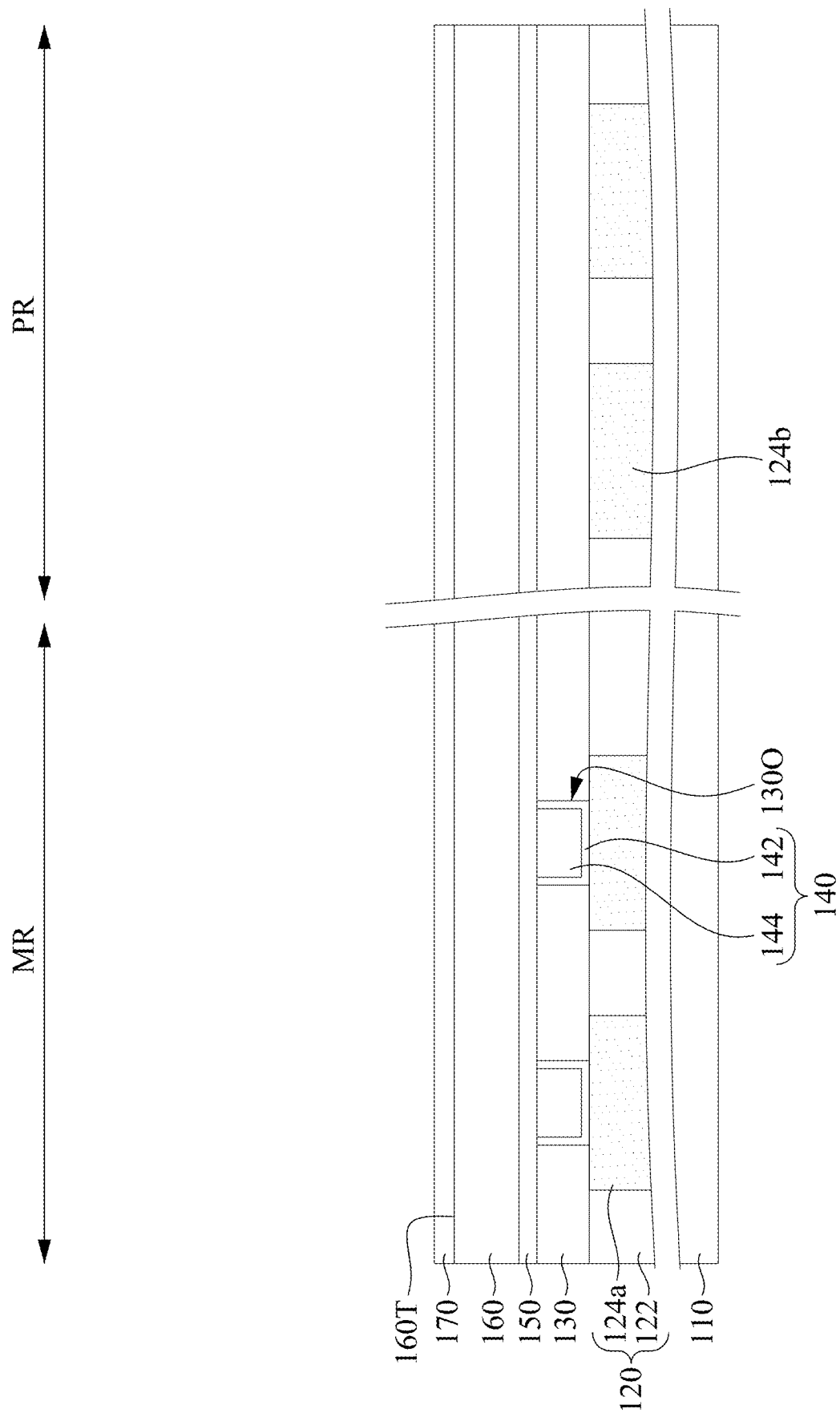

Reference is made to FIG. 1B and FIG. 8. The method M proceeds to operation S7 where a top electrode layer 170 is deposited over a top surface 160T of the ferroelectric layer 160. The top electrode layer 170 may include a conductive material. In some embodiments, the top electrode layer 170 may include a metal, such as tungsten (W), titanium (Ti), tantalum (Ta), platinum (Pt), ruthenium (Ru), aluminum (Al), copper (Cu), TiN, TaN, the like or combinations thereof. PVD, such as sputtering deposition, or the like may be used for forming the top electrode layer 170.

In some embodiments, an exemplary formation method of the top electrode layer 170 includes Ionized Physical Vapor Deposition (I-PVD), also referred to as Ionized Metal Plasma (IMP). In some embodiment, in the I-PVD process, metal atoms are ionized in an intense plasma, then can be directed by electric fields perpendicular to the wafer surface (e.g., the top surface of the substrate 110). Sputtering gas ions out of plasma are accelerated towards the target, such that metal atoms may be introduced into the plasma by sputtering from a target at the top of a reactor. In some embodiment, a high density plasma is generated in the central volume of the reactor by an Inductively Coupled Plasma (ICP) source, which may include a DC coil or radio frequency (RF) coil. This electron density is sufficient to ionize the metal atoms incident at the wafer surface. The ions from the plasma are accelerated and collimated at the surface of the wafer by the plasma sheath. The sheath is a region of intense electric field which is directed toward the wafer surface. The field strength is controlled by applying an alternative current (AC) bias (i.e., radio frequency bias) to the wafer chuck.

In some embodiments, in the I-PVD process, in addition to depositing materials on the wafer surface (depositing operations), the formed plasmas may remove material from the semiconductor wafer surface, which is referred to as a resputtering operation. "Resputtering" is herein defined as a plasma-based material removal and redistribution method in which net material removal occurs at least at one location on a wafer substrate, e.g., at a recess bottom. Resputtering can be integrated into the process flows for deposition of diffusion barrier and seed layer, and is used in conjunction with the depositing operations to achieve conformal coverage of a substrate with deposited material. Resputtering can be used, for example, to redistribute material from via bottoms to via sidewalls, to remove or reshape overhang at the openings of recessed features, to clean via bottoms, and to form anchor recesses. Resputtering can be performed in a PVD process chamber (a chamber having a sputter target) or in a plasma pre-clean chamber (a chamber without a sputter target). In those embodiments when resputtering is performed in a PVD chamber, etching and deposition are occurring simultaneously on a substrate. Etching is effected by the inert gas ions and, in some cases, by metal ions, impinging on the wafer with a sufficient momentum to dislodge the exposed material, while deposition is effected by neutral metal atoms being sputtered onto the wafer from the metal target and, in some cases, by metal ions, created in the plasma. When an intrinsic deposition rate D is greater than an intrinsic etch rate E, a net depositing process is occurring on the wafer surface. When the deposition rate D is smaller than the etch rate E, the process is characterized as a net etching process.

In some cases, for conformal coverage, the material of the top electrode layer 170 is deposited by a high directional I-PVD process on the top surface 160T of the ferroelectric layer 160. When a directionality of the I-PVD process is high, the positively charged ions impinging on the wafer surface acquire high kinetic energy, which allows them to easily dislodge material from the wafer surface (e.g., the top surface 160T of the ferroelectric layer 160). The high directional deposition method may result in high-energy resputter (e.g., high intrinsic etch rate), which may lead to damage to the exposed ferroelectric layer 160 (e.g. rougher ferroelectric layer or even formation of micro holes in the ferroelectric layer 160). The damage to the exposed ferroelectric layer 160 may degrade the recrystallization of the ferro phase in the ferroelectric layer 160 (e.g., the ferroelectric element 162 in FIG. 13) in subsequent processes (e.g., heat annealing process), thereby decreasing the area occupied by the ferro phase after the recrystallization (e.g., by heat annealing process) in subsequent processes. In other word, by using the I-PVD process with the high directionality substantially normal to the substrate 110, the non-ferro phase may occupy a large area in the ferroelectric layer (e.g., the ferroelectric element 162 in FIG. 14) after the recrystallization (e.g., by heat annealing process) in subsequent processes, resulting in small memory window, which may reduce the yield rate of the small-sized FeRAM cells.

In some embodiments of the present disclosure, depositing the top electrode layer is performed using a low directional deposition method ("low energy resputter"). The directionality of the I-PVD process may be tuned or by adjusting DC power, gas flow, AC bias, and DC/RF coil power to a low-directional mode, such that the underlying ferroelectric layer (e.g., the ferroelectric element 162 in FIG. 14) have more area in the ferro phase (or ferro crystal structures) that demonstrates the ferroelectric behavior after the recrystallization (e.g., by heat annealing process) in subsequent processes. In other word, the parameters of the deposition process are controlled to the low-directional mode such that the underlying ferroelectric layer (e.g., the ferroelectric element 162 in FIG. 14) have less non-ferro phase (or non-ferro crystal structures) that show little ferroelectric behavior after the recrystallization (e.g., by heat annealing process) in subsequent processes. That is, decreasing DC power, AC bias, DC/RF coil and increase gas flow may change pressure, ion energy, ion bombard, re-sputter, and electrode field during the top electrode deposition, thereby improving ferro phase percentage.

Figure 23:
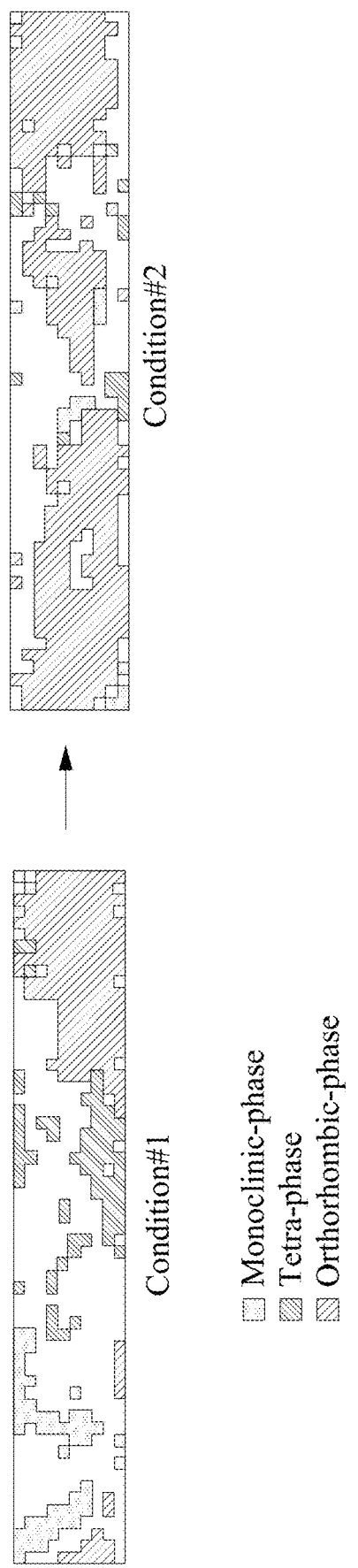
FIG. 23 is a graph illustrating experimental/simulation results showing phases in ferroelectric layers in different memory cells according to some embodiments of the present disclosure.

In some embodiments, the I-PVD process is controlled such that a ratio of the ferro phase in the ferroelectric layer (e.g., the ferroelectric element 162 in FIG. 14) is increased to be greater than about 40%. For example, the ratio of the ferro phase in the ferroelectric layer may be in a range from about 40% to about 95% in the finished product, for example, obtained after the recrystallization (e.g., by heat annealing process) in subsequent processes. In some embodiments, in the finished product, a ratio of the ferro phase in the ferroelectric layer (e.g., the ferroelectric element 162 in FIG. 14) is greater than a ratio of any other non-ferro phases in the ferroelectric layer (e.g., the ferroelectric element 162 in FIG. 14). In some embodiments, the ratio of the ferro phase in the ferroelectric layer (e.g., the ferroelectric element 162 in FIG. 14) can be referred to as a ratio of an area of ferro phase to an entire cell area of the ferroelectric layer (e.g., the ferroelectric element 162 in FIG. 14) as viewed from top, for example, by EBSD or PED, which is shown in FIG. 23 as will be discussed in greater detail later. For example, the entire cell area of the ferroelectric layer (e.g., the ferroelectric element 162 in FIG. 14) is substantially equal to a combination of areas of ferro and non-ferro phases and other areas in the ferroelectric layer (e.g., the ferroelectric element 162 in FIG. 14).

In some embodiments where the ferroelectric element 162 includes HZO, the parameters in the deposition process is controlled such that a ratio of the ferro phase in HZO (e.g., the orthorhombic phase) is in a range from about 40% to about 95% in the HZO. In some embodiments, for example, a ratio of the ferro phase (e.g., orthorhombic phase) in HZO is greater than a ratio of any other non-ferro phases (e.g., the tetragonal phase or the monoclinic phase) in HZO.

In some embodiments where the ferroelectric element 162 includes $BaTiO_3$, the parameters in the deposition process is controlled such that a ratio of the ferro phase in $BaTiO_3$ (e.g., the tetragonal phase) is in a range from about 40% to about 95% in the $BaTiO_3$. In some embodiments, for example, a ratio of the ferro phase (e.g., tetragonal phase) in the $BaTiO_3$ is greater than a ratio of any other non-ferro phases (e.g., cubic phase) in the $BaTiO_3$.

In some embodiments where the ferroelectric element 162 includes PZT, the parameters in the deposition process is controlled such that a ratio of the ferro phase in PZT (e.g., the monoclinic phase) is in a range from about 40% to about 95% in the PZT. In some embodiments, a ratio of the ferro phase (e.g., monoclinic phase) in the PZT is greater than a ratio of any other non-ferro phases (e.g., cubic phase) in the PZT.

In some embodiments, a processing apparatus for performing an I-PVD includes a processing chamber, a sputtering target, a DC power source, a wafer support, a bias source, a sputtering gas source, a vacuum pump, an ICP source, and a controller. The sputtering target may be in the processing chamber and at one end of the processing chamber, and having a target surface facing a center of the processing chamber. The DC power source is coupled to the sputtering target. The DC power source may energizes the target to provide sputtered material into the chamber during deposition modes. The wafer support is in the processing chamber and spaced from the sputtering target and has a support surface facing the sputtering target. In some embodiments, a wafer is held on the support surface of the wafer support. For example, the wafer support may be a temperature-controlled electrostatic chuck. In some embodiments, the bias source is connected to the wafer support and configured to impose a negative bias to the wafer held by the wafer support. The sputtering gas source may provide a sputtering gas to the chamber. The sputtering gas may be an inert gas, such as argon. In some embodiments, the sputtering gas source and the vacuum pump are coupled to the chamber to maintain a pressure of the sputtering gas in the chamber. In some embodiments, the ICP source is operable to inductively couple RF energy into the chamber between the sputtering target and the wafer support to form a high density plasma in the chamber to ionize sputtering gas to contribute to the sputtering of material from the sputtering target during deposition modes, and to ionize sputtered material for deposit onto the wafer. For example, the ICP source may include a coil and a power source coupled to the coil. In some embodiments, the controller is programmed to operate plural deposition modes and/or etch modes of the apparatus sequentially.

In some embodiments, for achieving the desired percentage of the ferro phase (or ferro crystal structure) in the ferroelectric element 162 (referring to FIG. 14), the controller is programmed such that the DC power in the deposition process is controlled in a range from about 2000 W to about 7000 W; the gas flow (e.g., Ar gas flow) in the deposition process is controlled in a range from about 30 sccm to about 50 sccm; the AC bias in the deposition process is controlled in a range from about 0 W to about 50 W; and the DC/RF coil power in the deposition process is controlled in a range from about 0 W to about 500 W. In other word, in some embodiments, the deposition process may be performed with an AC bias in a range greater than about 0 W to about 50 W, or performed without an AC bias in some alternative embodiments. In other word, in some embodiments, the deposition process may be performed with an DC/RF coil power in a range greater than about 0 W to about 500 W, or performed without an DC/RF coil power in some alternative embodiments. If the DC power in the deposition process is out of the range, the ratio of non-ferro phase in the ferroelectric element 162 (referring to FIG. 14) in the finished product may increase. If the gas flow in the deposition process is out of the range, the ratio of non-ferro phase in the ferroelectric element 162 (referring to FIG. 14) in the finished product may increase. If the AC bias in the deposition process is greater than 50 W, the ratio of non-ferro phase in the ferroelectric element 162 (referring to FIG. 14) in the finished product may increase. If the DC/RF coil power in the deposition process is greater than 500 W, the ratio of non-ferro phase in the ferroelectric element 162 (referring to FIG. 14) in the finished product may increase.

In some embodiments, for depositing the top electrode layer 170 with low directionality to achieve the desired percentage of the ferro phase (or ferro crystal structure) in the ferroelectric element 162 (referring to FIG. 14), the controller is programmed such that an etch rate to deposition rate (E/D) ratio in the deposition process is in a range from about 0.5 to about 3.5. The E/D ratio is used to characterize the resputtering and deposition processes. The E/D ratio may be referred to as a ratio of a net deposition rate and a etch rate. As used herein, the "net deposition rate" refers to the deposition rate that is measured when deposition and etching are occurring simultaneously. The "etch rate" is the removing rate measured when the process recipe is run without deposition gases. At the E/D ratio of 1, no net deposition or etching is occurring. At the E/D ratio of 0, the process is entirely depositing. At E/D ratios of greater than 1 etching predominates, this being characteristic of resputter. An E/D ratio can be modulated by modulating the process parameters, such as the DC power applied to the sputter target and the AC bias applied to the wafer.

In the present embodiments, since a top surface 160T of the ferroelectric layer 160 that receives the materials of the top electrode layer 170 is substantially flat, materials of the top electrode layer 170 can be uniformly deposited onto the flat top surface 160T without conformal coating techniques (e.g., the high-directional I-PVD process that features conformal coverage). Therefore, the I-PVD process with the low directionality may not reduce the quality of the top electrode layer 170 (e.g. uniformity of the top electrode layer 170). For example, an interface between the top electrode layer 170 and the ferroelectric layer 160 may extend substantially along a top surface of the substrate 110, and a top surface of the top electrode layer 170 may extend substantially along the top surface of the substrate 110. Furthermore, since the ferro phase occupies a major area in the ferroelectric layer 160, phases of the underlying ferroelectric layer 160 becomes more uniform, such that the uniformity of the top electrode layer 170 can be improved. For example, in some embodiments, the uniformity of the top electrode layer 170 can be increased more than 30%, which can be observed from atomic force microscope (AFM).

In some embodiments, the mode of the I-PVD process for the top electrode layer 170 is different from a mode of a I-PVD process for the other one or more conducive features, such that the directionality of the I-PVD process substantially normal to the substrate 110 for depositing the top electrode layer 170 is lower than a directionality of the I-PVD process substantially normal to the substrate 110 for depositing the other one or more conducive features. For example, the DC power, the AC bias, and/or the DC/RF coil power in the I-PVD process for the top electrode layer 170 is lower than the DC power, the AC bias, and/or the DC/RF coil power in the I-PVD process for other one or more conducive features. For example, the E/D ratio in the I-PVD process for the top electrode layer 170 is lower than an E/D ratio in the I-PVD process for the other one or more conducive features. The other one or more conducive features mentioned herein may include the diffusion barrier layer 142 and/or the filling metal 144 in BEVA 140, the bottom electrode layer 150, and conductive features including one or plural metal layers (e.g., the conductive features 124*a* and 124*b*, and metal layers M1-M3 in FIG. 19) and one or plural metal vias (e.g., vias V1-V3 in FIG. 19) in the interconnect layers formed prior to the formation of memory cells, and conductive features including one or plural metal layers (e.g., the metal lines 234*a* and 234*b* in FIG. 14, and metal layers M4-M5 in FIG. 19) and one or plural metal vias (e.g., vias 232*a* and 232*b* in FIG. 14, and vias V4-V5 in FIG. 19) in the interconnect layers formed after the formation of memory cells.

In some further embodiments where the diffusion barrier layer 142 and/or the filling metal 144 in BEVA 140 is deposited by I-PVD process, the directionality of the I-PVD process for the top electrode layer 170 is lower than a directionality of the I-PVD process for the diffusion barrier layer 142 and/or the filling metal 144. For example, the DC power, the AC bias, and/or the DC/RF coil power in the I-PVD process for the top electrode layer 170 is lower than the DC power, the AC bias, and/or the DC/RF coil power in the I-PVD process for the diffusion barrier layer 142 and/or the filling metal 144. For example, the E/D ratio in the I-PVD process for the top electrode layer 170 is lower than an E/D ratio in the I-PVD process for the diffusion barrier layer 142 and/or the filling metal 144.

In some further embodiments where the bottom electrode layer 150 is deposited by I-PVD process, the directionality of the I-PVD process for the top electrode layer 170 is lower than a directionality of the I-PVD process for the bottom electrode layer 150. For example, the DC power, the AC bias, and/or the DC/RF coil power in the I-PVD process for the top electrode layer 170 is lower than the DC power, the AC bias, and/or the DC/RF coil power in the I-PVD process for the bottom electrode layer 150. For example, the E/D ratio in the I-PVD process for the top electrode layer 170 is lower than an E/D ratio in the I-PVD process for the bottom electrode layer 150.

In some further embodiments where some layers of the conductive features 124*a* and 124*b* are deposited by I-PVD process, the directionality of the I-PVD process for the top electrode layer 170 is lower than a directionality of the I-PVD process for the layers of the conductive features 124*a* and 124*b*. For example, the DC power, the AC bias, and/or the DC/RF coil power in the I-PVD process for the top electrode layer 170 is lower than the DC power, the AC bias, and/or the DC/RF coil power in the I-PVD process for the layers of the conductive features 124*a* and 124. For example, the E/D ratio in the I-PVD process for the top electrode layer 170 is lower than an E/D ratio in the I-PVD process for the conductive features 124*a* and 124*b*.

Figure 9:
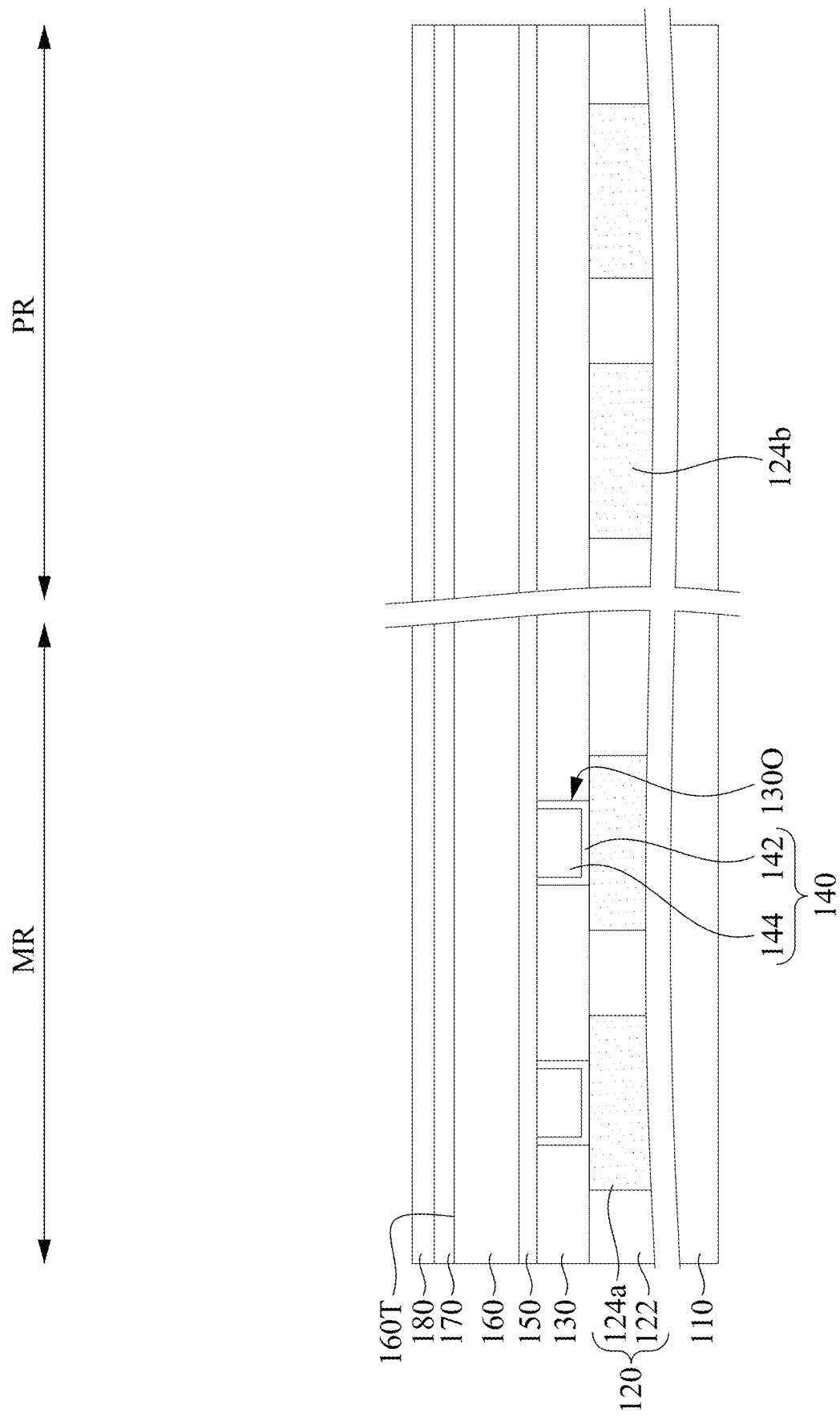

Reference is made to FIG. 1B and FIG. 9. The method M proceeds to operation S8 where a hard mask layer 180 is deposited over the top electrode layer 170. In some embodiments, the hard mask layer 180 is formed of a dielectric material. For example, the hard mask layer 180 may be include silicon carbide (SiC), silicon oxynitride (SiON), silicon nitride (SiN), silicon dioxide ($SiO_2$), ashing removable dielectric (ARD), the like, and/or combinations thereof. The hard mask layer 180 may be a single-layer structure or multi-layer structure. The materials of the hard mask layer 180 may be formed by suitable deposition techniques, such as CVD, ALD, PVD, the like, and/or combinations thereof.

Figure 10:
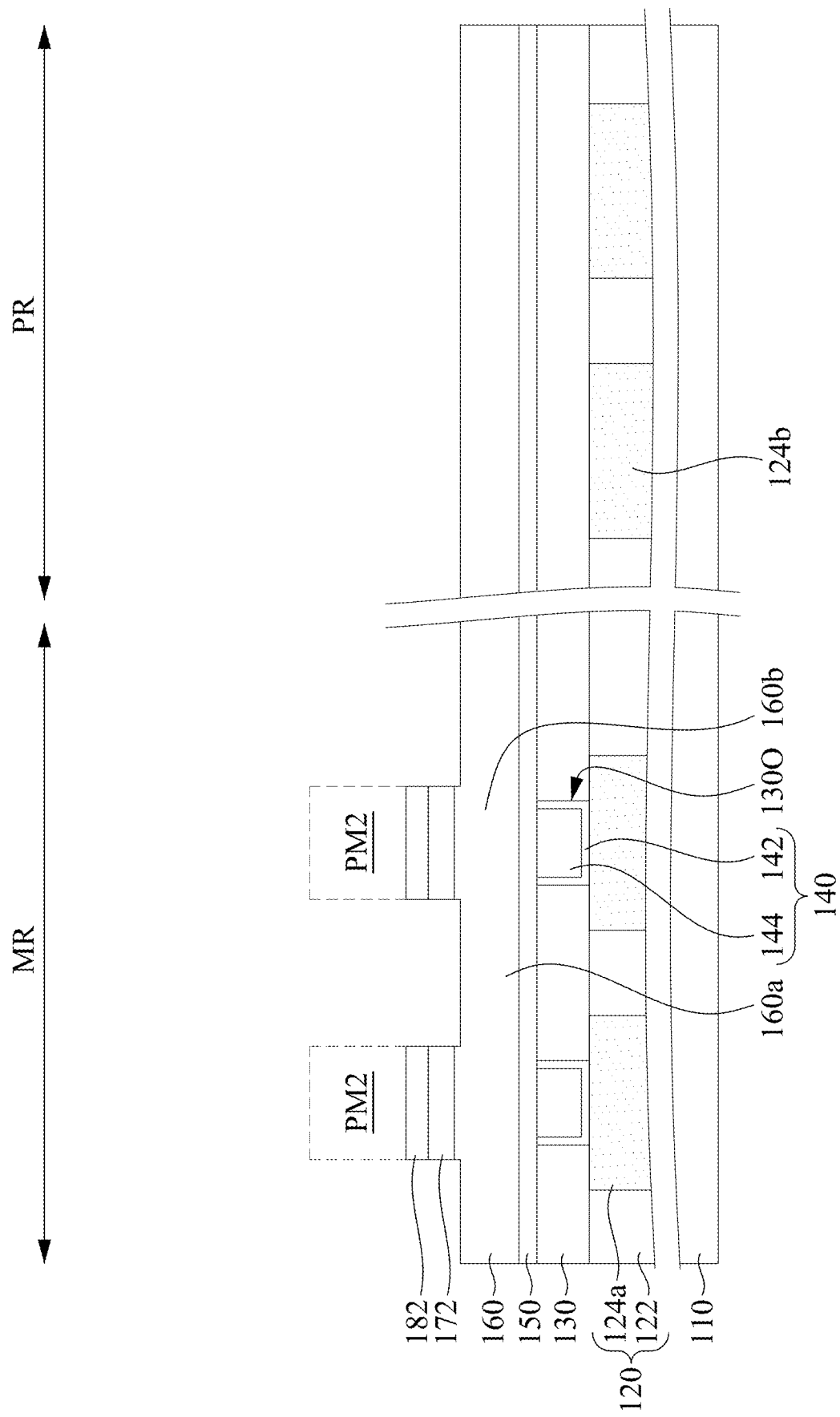

Reference is made to FIG. 1B and FIG. 10. The method M proceeds to operation S9 where the hard mask layer 180 and the top electrode layer 170 (referring to FIG. 9) are patterned into hard masks 182 and top electrodes 172, respectively.

In some embodiments, a resist layer is formed over the hard mask layer 180 and patterned using suitable photolithography process, thereby forming the patterned resist layer PM2. For example, the process may include photoresist coating (e.g., spin-on coating), soft baking, mask aligning, exposure, post-exposure baking, developing the photoresist, rinsing, drying (e.g., hard baking), other suitable processes, or combinations thereof. In some embodiments, the patterned resist layer PM2 is an ashing removable dielectric (ARD), which is a photoresist-like material generally having generally the properties of a photoresist and amendable to etching and patterning like a photoresist. The patterned resist layer PM2 may also acts as a mask layer for patterning underlying layers in some embodiments. In some embodiments, the patterned resist layer PM2 includes an organic material, such as polymer. In some embodiments, the patterned resist layer PM2 includes SiON. The patterned resist layer PM2 may be formed by spin-on coating, CVD, PVD, ALD, or other suitable processes.

The patterning process to the hard mask layer 180 and the top electrode layer 170 (referring to FIG. 9) may include one or more suitable etching processes. For example, a first etch process is performed to etch the hard mask layer 180 (referring to FIG. 8) through the patterned resist layer PM2, such that portions of the hard mask layer 180 (referring to FIG. 9) uncovered by the patterned resist layer PM2 are removed. The remaining portions of the hard mask layer 180 (referring to FIG. 9) form the hard mask 182. The first etching process may be a dry etch using fluoride-based etchants, such as $CF_4$. The top electrode layer 170 (referring to FIG. 9) may have a higher etch resistance to the etchants than that of the hard mask layer 180 (referring to FIG. 9), thereby protecting underlying layers from being etched.

Subsequently, a second etch process is performed to etch the top electrode layer 170 (referring to FIG. 9), such that portions of the top electrode layer 170 (referring to FIG. 9) uncovered by the hard masks 182 are removed. The remaining portions of the top electrode layer 170 (referring to FIG. 9) form the top electrode 172. The second etching process may be a dry etch using fluoride-based etchants, such as CF4. The ferroelectric layer 160 may have a higher etch resistance to the etchants than that of the top electrode layer 170 (referring to FIG. 9), thereby protecting underlying layers from being etched.

In some embodiments, the etching processes may further consume a portion 160*a* of the ferroelectric layer 160 exposed by the top electrode 172. As a result, in some embodiments, after the etching process, a top surface of the portion 160*a* of the ferroelectric layer 160 exposed by the top electrode 172 is lower than a top surface of a portion 160*b* of the ferroelectric layer 160 below the top electrode 172. In some embodiments, the patterned resist layer PM2 and/or the hard masks 182 may be consumed and removed by the etching processes. After the etching processes, the patterned resist layer PM2 may be removed by suitable ashing processes.

Figure 11:
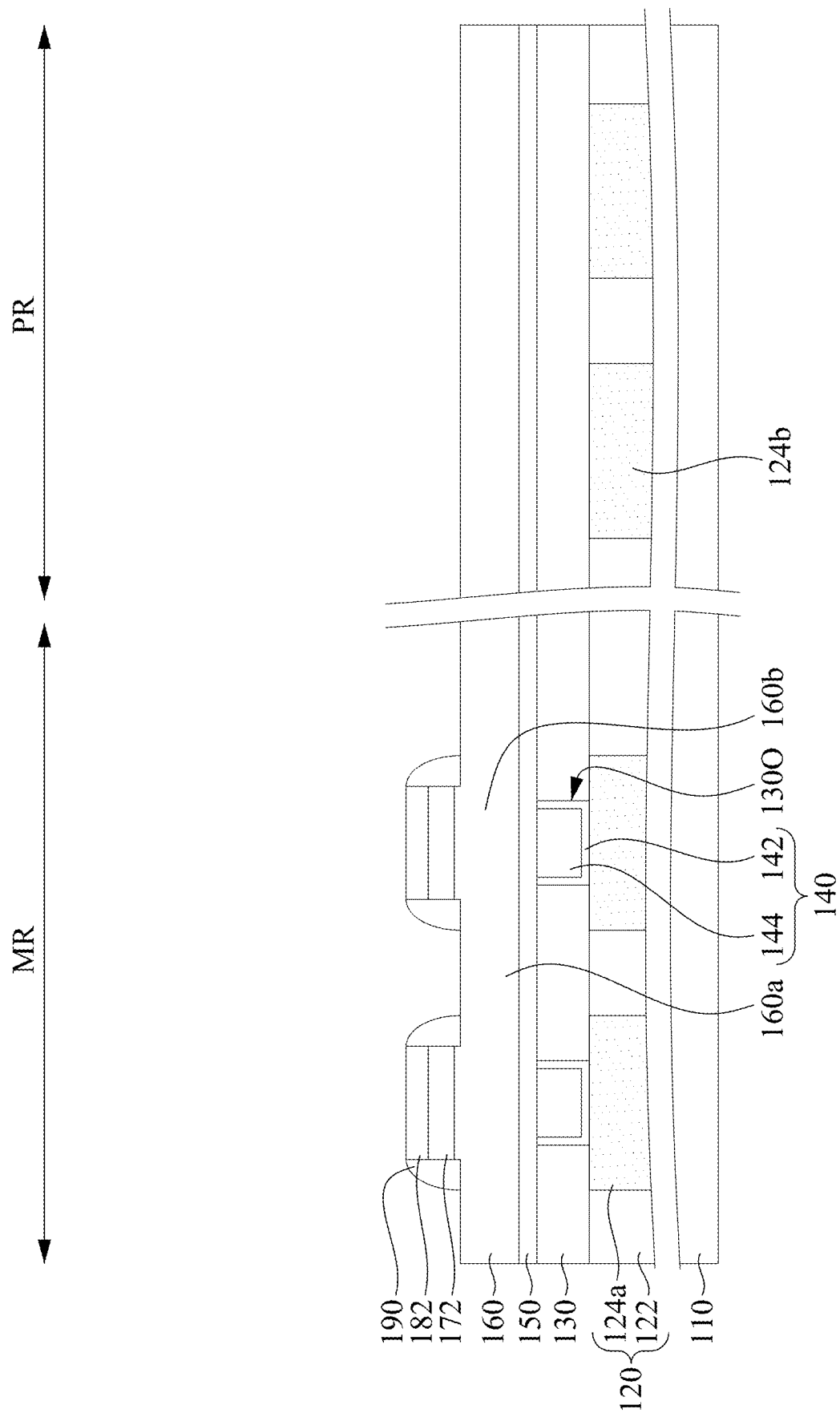

Reference is made to FIG. 1B and FIG. 11. The method M proceeds to operation S10 where spacers 190 are formed around the hard masks 182, the top electrodes 172, and top parts of the portion 160*a* of the ferroelectric layer 160. The spacers 190 may be made of silicon nitride, silicon oxynitride, and silicon oxide. The spacers 190 may be formed by conformally coating a spacer material covering the top and sidewalls of the hard masks 182, the top electrodes 172, and the top parts of the portion 160*a*, and then etching the spacer material. Because of the shape of the conformal deposition, the spacer material over the hard masks 182 is removed during this etch, and left the spacers 190. The spacers 190 surrounds the hard masks 182 and the top electrodes 172, and thus protects them against subsequent etch operations. The height and width of spacers 190 after etching may be tuned by adjusting deposition and etching parameters.

Figure 12:
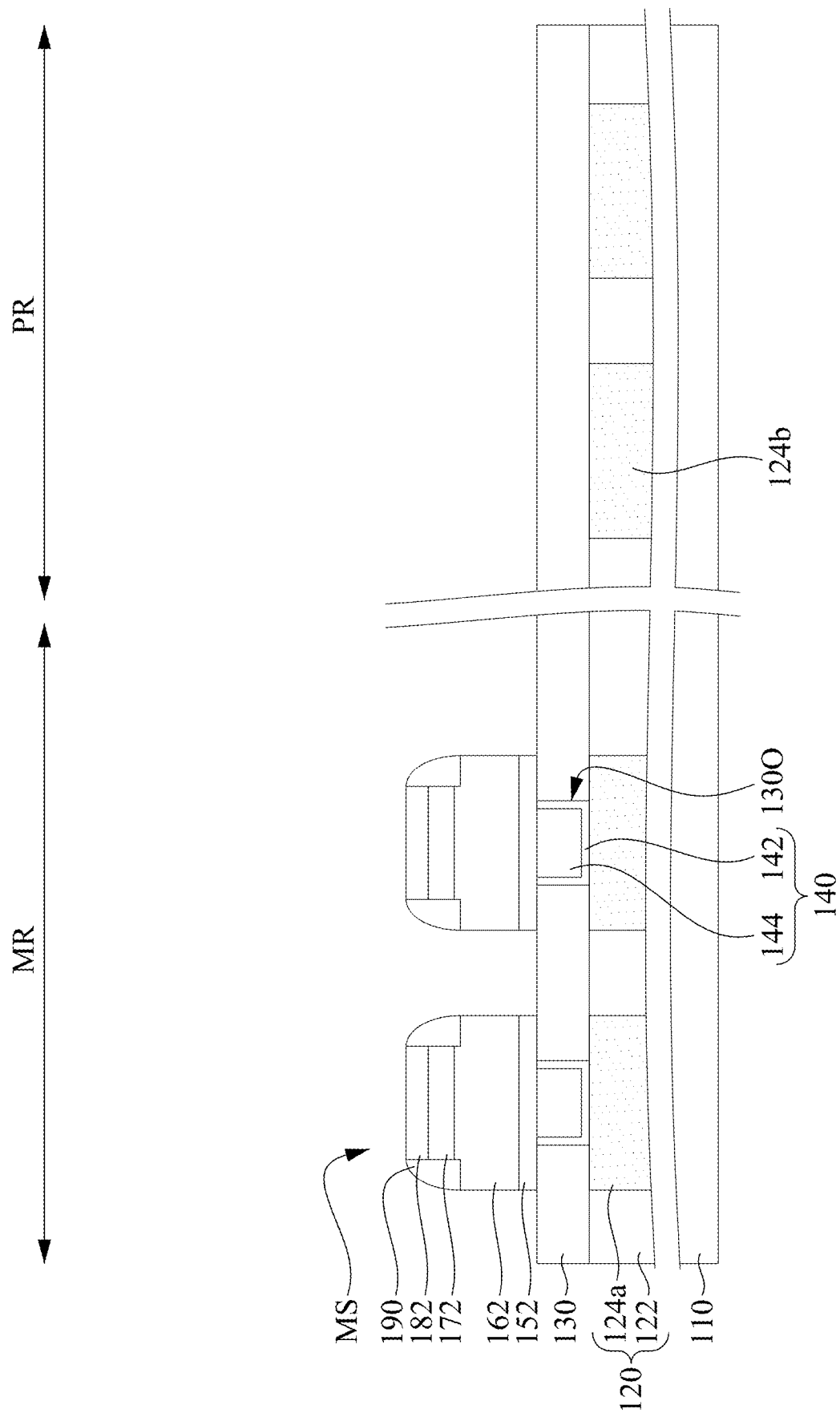

Reference is made to FIG. 1B and FIG. 12. The method M proceeds to operation S11 where the ferroelectric layer 160 and the bottom electrode layer 150 (referring to FIG. 11) are patterned into ferroelectric elements 162 and bottom electrodes 152. The spacers 190 and the hard masks 182 are used as an etch mask to remove a portion of the ferroelectric layer 160 and the bottom electrode layer 150 (referring to FIG. 11). Through the steps, the memory structures MS are formed, and each of the memory structures MS includes the bottom electrode 152, the ferroelectric element 162, the top electrode 172, the hard mask 182, and the spacers 190. In some embodiments, as illustrated previously, an interface between the top electrode 172 and the ferroelectric element 162 extends substantially along a top surface of the substrate 110.

Figure 13:
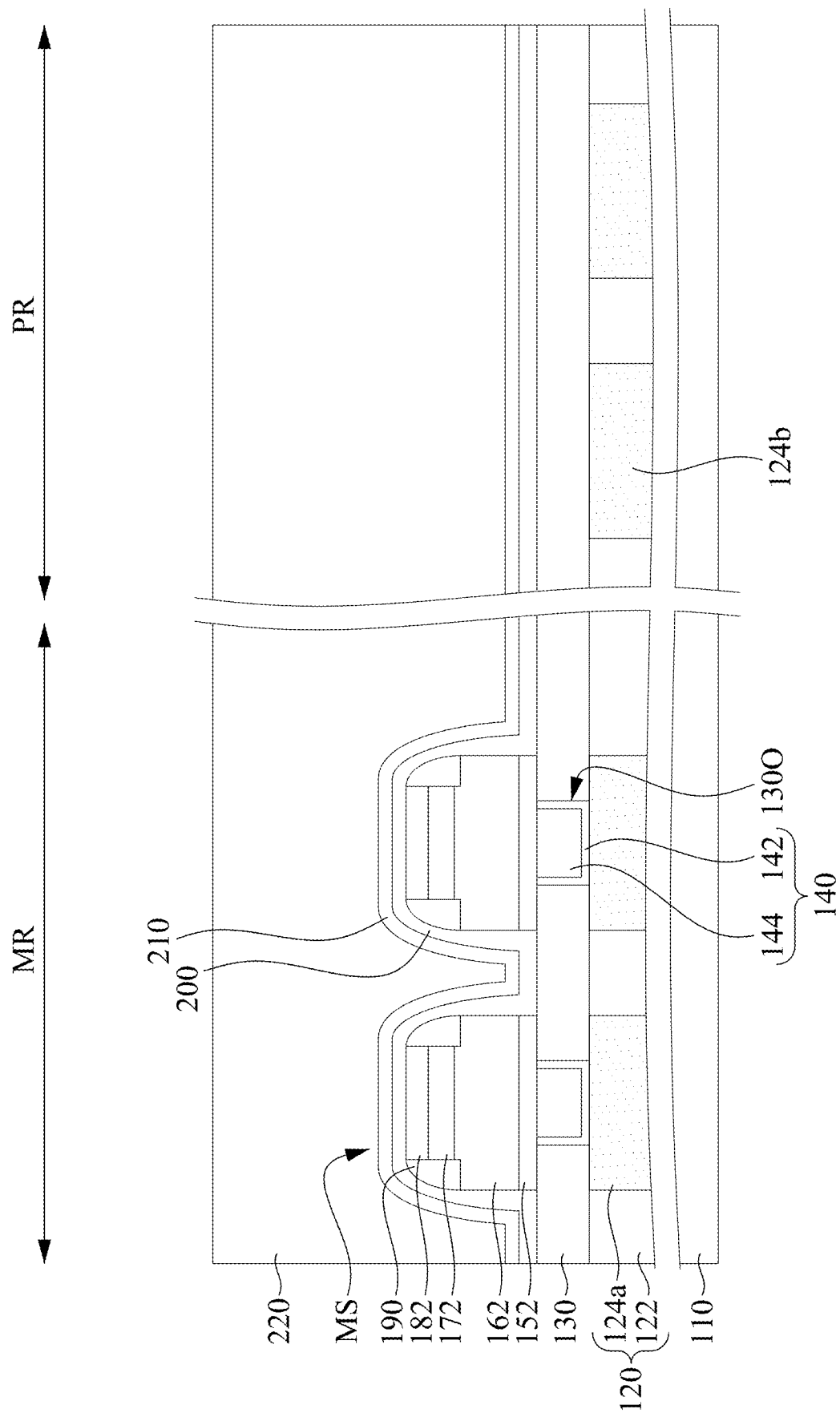

Reference is made to FIG. 1B and FIG. 13. The method M proceeds to operation S12 where a protective layer 200 is conformally formed over the memory structures MS. The protective layer 200 may be the same material as the dielectric layer 130. The protective layer 200 may be silicon carbide, silicon oxynitride, silicon nitride, carbon doped silicon nitride or carbon doped silicon oxide. The protective layer 200 is selected to have a different etch selectivity than overlying dielectric layer material formed in later processes. The protective layer 200 is deposited conformally over the memory structures MS using a chemical vapor deposition (CVD) process such as plasma enhanced (PE) CVD, high-density plasma (HDP) CVD, inductively-coupled-plasma (ICP) CVD, or thermal CVD.

Then, a conformal dielectric layer 210 is conformally formed over the protective layer 200. The conformal dielectric layer 210 may be made of tetra-ethyl-ortho-silicate (TEOS) or other suitable dielectric materials, as examples. The conformal dielectric layer 210 may be deposited using a CVD, plasma enhanced CVD (PECVD), PVD, or other suitable technique.

An ILD layer 220 is deposited over the conformal dielectric layer 210 using suitable deposition techniques. The ILD layer 220 may be silicon oxide, extreme or extra low-k silicon oxide such as a porous silicon oxide layer. For example, the ILD layer 220 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. In some embodiments, a heat annealing process is performed to cure/solidify the ILD layer 220 and diffuse ions from the ILD layer 220 after depositing the ILD layer 220. The heat annealing process may result in the recrystallization of the ferro phase in the ferroelectric element 162.

Figure 14:
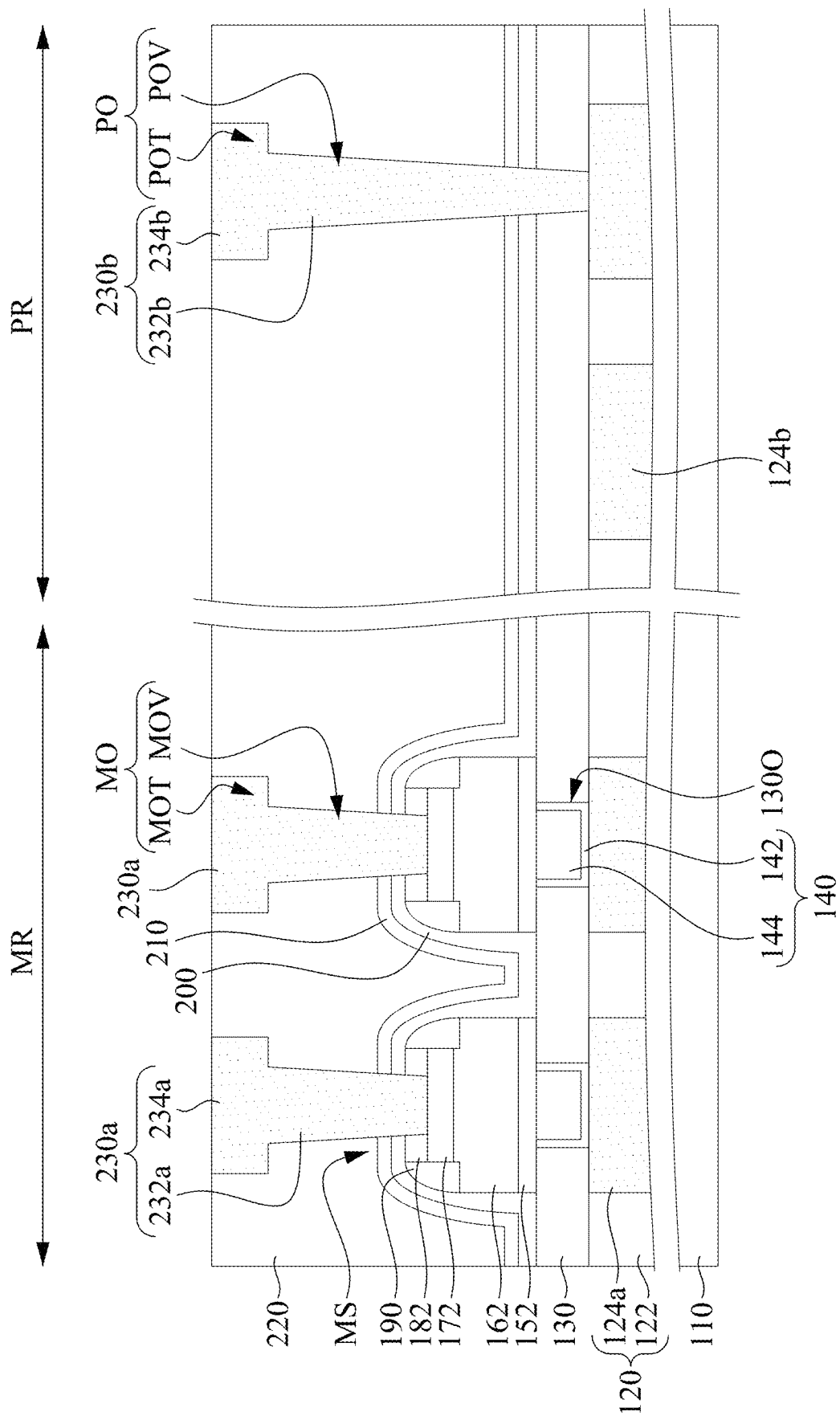

Reference is made to FIG. 1B and FIG. 14. The method M proceeds to operation S13 where conductive features 230*a* and 230*b* are formed in the ILD layer 220, the conformal dielectric layer 210, and the protective layer 200, and respectively connected to the memory structures MS and the conductive features 124*b*.

In some embodiments, top electrode openings MO and an interconnect opening PO are first formed in the ILD layer 220, the conformal dielectric layer 210, and the protective layer 200. In some embodiments, formation of the top electrode opening MO and the interconnect opening PO may include a via etching process, a trench etching process, and a liner removal process. The via etching process may be performed to etch a via opening MOV in the ILD layer 220 and the conformal dielectric layer 210 in the memory region MR and etch a via opening POV in the ILD layer 220 and the conformal dielectric layer 210 in the logic region LR. The trench etching process may be performed to etch a trench opening MOT in the ILD layer 220 in the memory region MR, etch a trench opening POT in the ILD layer 220 in the logic region LR. The via etching process and the trench etching process may include suitable anisotropic etching processes. In some embodiments where the ILD layer 220 is silicon oxide, the etchant used in the via etching process and the trench etching process can be dilute hydrofluoric acid (HF), HF vapor, $CF_4$, $C_4F_8$, $CH_xF_y$, $C_xF_y$, $SF_6$, or $NF_3$, Ar, $N_2$, $O_2$, Ne, or other gas. Sometimes, the trench etching process may deepen the via openings MOV and POV after the via etching process. Alternative, in some other embodiments, the trench etching process may be performed prior to the via etching process. In some embodiments, in the logic region LR, the protective layer 200 and dielectric layer 130 may have a higher etch resistance to the via and trench etching processes than that of the ILD layer 220 and the conformal dielectric layer 210, such that the via and trench etching processes may stop at the protective layer 200 and dielectric layer 130. The protective layer 200 and the dielectric layer 130 may be referred to as an etch stop layer in some embodiments.

After the trench etching process and the via etching process, the liner removal process may be performed to remove a portion of the protective layer 200, the dielectric layer 130, and the hard mask 182 exposed by the via opening MOV and POV, such that the via openings MOV and POV may respectively expose the underlying top electrodes 172 and the conductive feature 124*b*. The liner removal process may include one or more isotropic etching processes, such as dry etching processes using $CH_2F_2$ and Ar as etching gases. In some embodiments, the underlying top electrodes 172 and the conductive feature 124*b* may have a higher etch resistance to the liner removal process than that of the protective layer 200, the dielectric layer 130, and the hard mask 182, such that the liner removal process may stop at the top electrodes 172 and the conductive feature 124*b* and not damage the underlying layers.

After the formation of the top electrode openings MO and the interconnect opening PO, the top electrode openings MO and the interconnect opening PO are filled with a conductive material. The conductive material may include a metal conductor, such as aluminum, aluminum alloy, copper, copper alloy, titanium, titanium nitride, tantalum, tantalum nitride, tungsten, cobalt, the like, and/or combinations thereof. The metal conductor may be deposited using PVD or one of the plating methods, such as electrochemical plating. The conductive material may also include one or more liner and barrier layers in additional a metal conductor. The liner and/or barrier may be conductive and deposited using CVD or PVD. After filling the conductive material, a planarization process, such as chemical mechanical polishing (CMP), is performed to remove excess conductive material out of the top electrode openings MO and the interconnect opening PO. The remaining conductive material may form the conductive features 230*a* and 230*b* in the top electrode opening MO and the interconnect opening PO, respectively. As illustrated in the figure, the conductive features 230*a* may include top electrode via 232*a* and metal lines 234a, and the conductive features 230b may include conductive via 232b and meta lines 234b.

In some further embodiments where the conductive materials of the fill metal, the liner and/or barrier of conductive features 230a and 230b are deposited by I-PVD process, the directionality of the I-PVD process for depositing the top electrode layer 170 is lower than a directionality of the I-PVD process for depositing the conductive materials of the fill metal, the liner and/or barrier of conductive features 230a and 230b. For example, the DC power, the AC bias, and/or the DC/RF coil power in the I-PVD process for depositing the top electrode layer 170 is lower than the DC power, the AC bias, and/or the DC/RF coil power in the I-PVD process for depositing the conductive materials of the fill metal, the liner and/or barrier of conductive features 230a and 230b. For example, the E/D ratio in the I-PVD process for the top electrode layer 170 is lower than an E/D ratio in the I-PVD process for the conductive materials of the fill metal, the liner and/or barrier of conductive features 230a and 230b.

Figure 15:
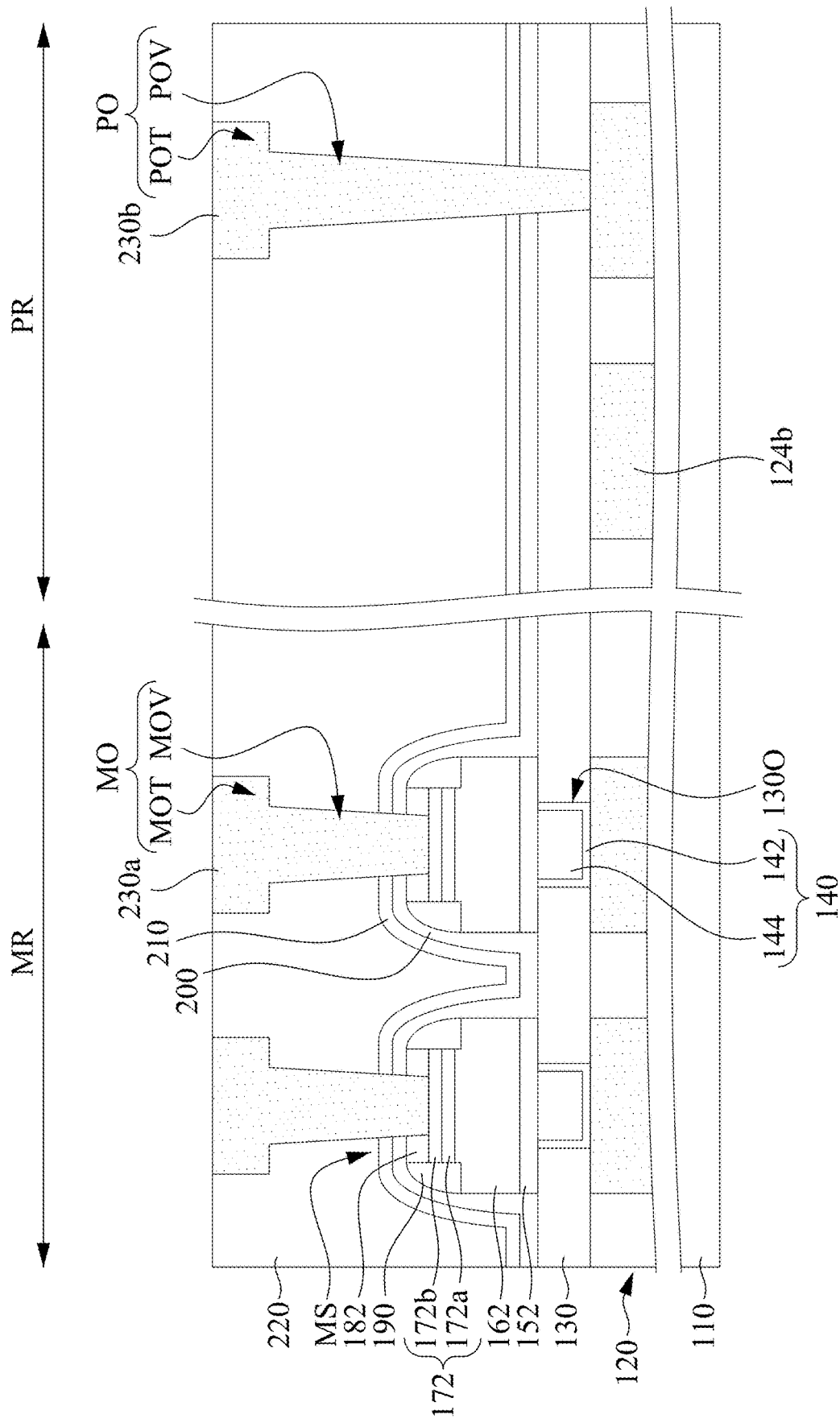
FIG. 15 is a cross-sectional view of an integrated circuit device in accordance with some embodiments of the present disclosure.

FIG. 15 is a cross-sectional view of an integrated circuit device in accordance with some embodiments of the present disclosure. The present embodiments are similar to those illustrated with respect to the embodiments of FIGS. 2-14, except that in the present embodiments, the top electrodes 172 may be a multi-layer structure. For example, each of the top electrodes 172 includes a first electrode layer 172a and a second electrode layer 172b over the first electrode layer 172a. The first electrode layer 172a may include a conductive material, such as TiN, TaN, Ru, Rh, Pd, Os, Ir, Pt, which can act as a suitable barrier to prevent metal diffusion to the ferroelectric elements 162. The second electrode layer 172b may include a conductive material, such as tungsten (W), titanium (Ti), tantalum (Ta), platinum (Pt), ruthenium (Ru), aluminum (Al), copper (Cu), TiN, TaN, the like or combinations thereof. The first and second electrode layers 172a and 172b may include different materials, such that the first electrode layer 172a may be more resistant to metal diffusion than the second electrode layer 172b is. PVD, such as sputtering deposition, or the like may be used for forming the first and second electrode layers 172a and 172b. An exemplary formation method of the first and second electrode layers 172a and 172b includes I-PVD.

In some embodiments, when depositing materials of the first electrode layer 172a, parameters in the deposition process are controlled such that the underlying ferroelectric layer 160 have more areas in ferro phase that demonstrate the ferroelectric behavior. In other word, the parameters of the deposition process are controlled such that the underlying ferroelectric layer 160 have less non-ferro phase (or non-ferro crystal structures) that show little ferroelectric behavior. Other details of the present embodiments are similar to those illustrated in the embodiments of FIGS. 2-14, and therefore not repeated herein.

Figure 16:
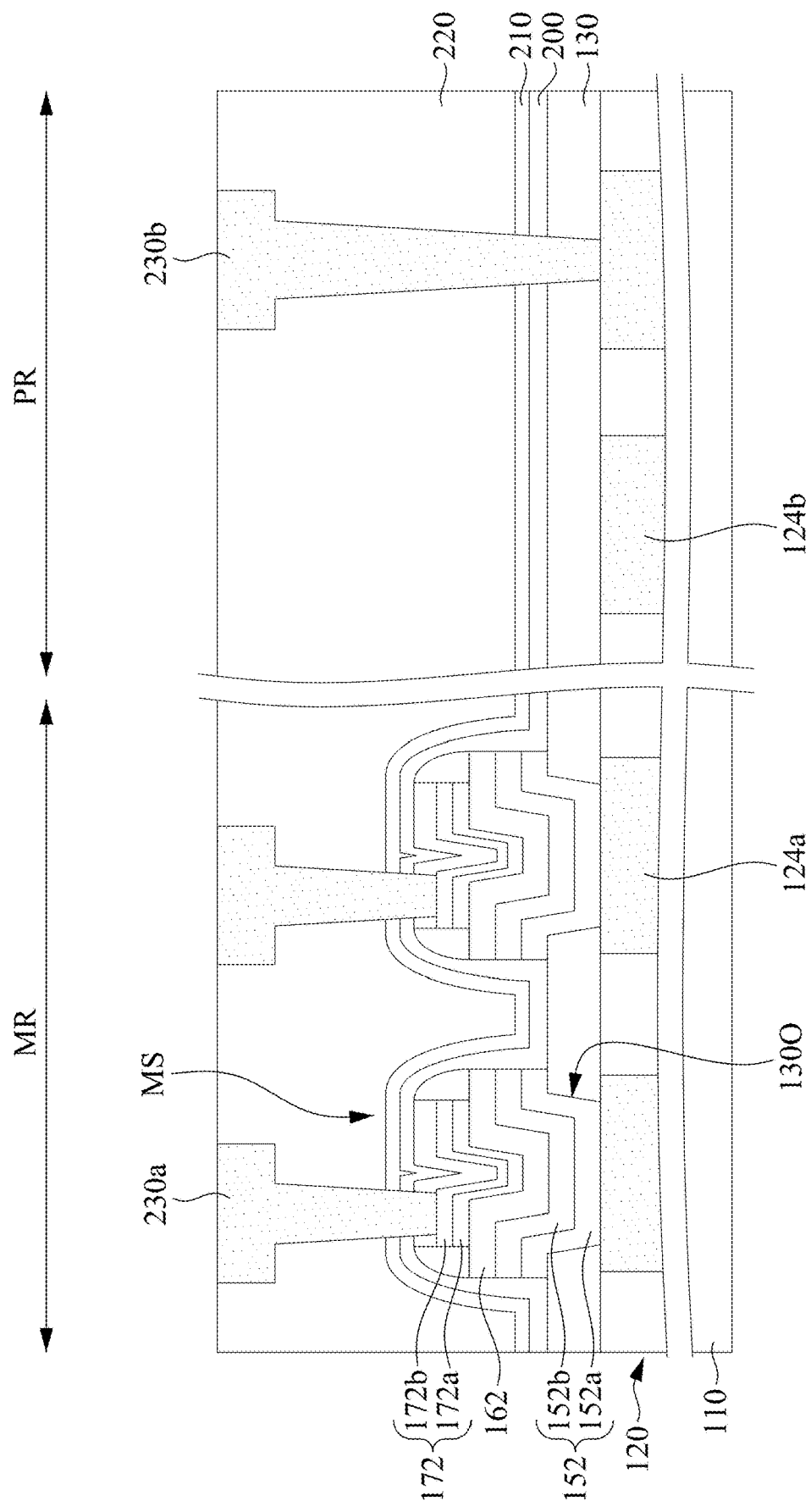
FIG. 16 is a cross-sectional view of an integrated circuit device in accordance with some embodiments of the present disclosure.

FIG. 16 is a cross-sectional view of an integrated circuit device in accordance with some embodiments of the present disclosure. The present embodiments are similar to those illustrated with respect to the embodiments of FIGS. 2-14, except that the bottom electrodes 152 respectively extend into the openings 130O in the dielectric layer 130 and are respectively connected to conductive features 124a. The BEVA 140 may be omitted in the present embodiments. In some embodiments, bottom electrodes 152 may have a profile corresponding to the openings 130O, and the ferroelectric elements 162, the top electrodes 172, and the hard masks 182 overlying the bottom electrodes 152 have the profile correspondingly.

In the present embodiments, the bottom electrodes 152 may be a multi-layer structure. For example, each of the bottom electrodes 152 includes a first electrode layer 152a and a second electrode layer 152b over the first electrode layer 152a. The first electrode layer 152a may include a conductive material, such as tungsten (W), titanium (Ti), tantalum (Ta), platinum (Pt), ruthenium (Ru), aluminum (Al), copper (Cu), TiN, TaN, the like or combinations thereof. The second electrode layer 152b may include a conductive material, such as TiN, TaN, Ru, Rh, Pd, Os, Ir, Pt, which can act as a suitable barrier to prevent metal diffusion to the ferroelectric elements 162. The first and second electrode layers 152a and 152b may include different materials, such that the second electrode layer 152b may be more resistant to metal diffusion than the first electrode layer 152a is. An exemplary formation method of the first and second electrode layers 152a and 152b includes PVD (e.g., sputtering deposition), or the like. Other details of the present embodiments are similar to those illustrated in the previous embodiments, and therefore not repeated herein.

Figure 17:
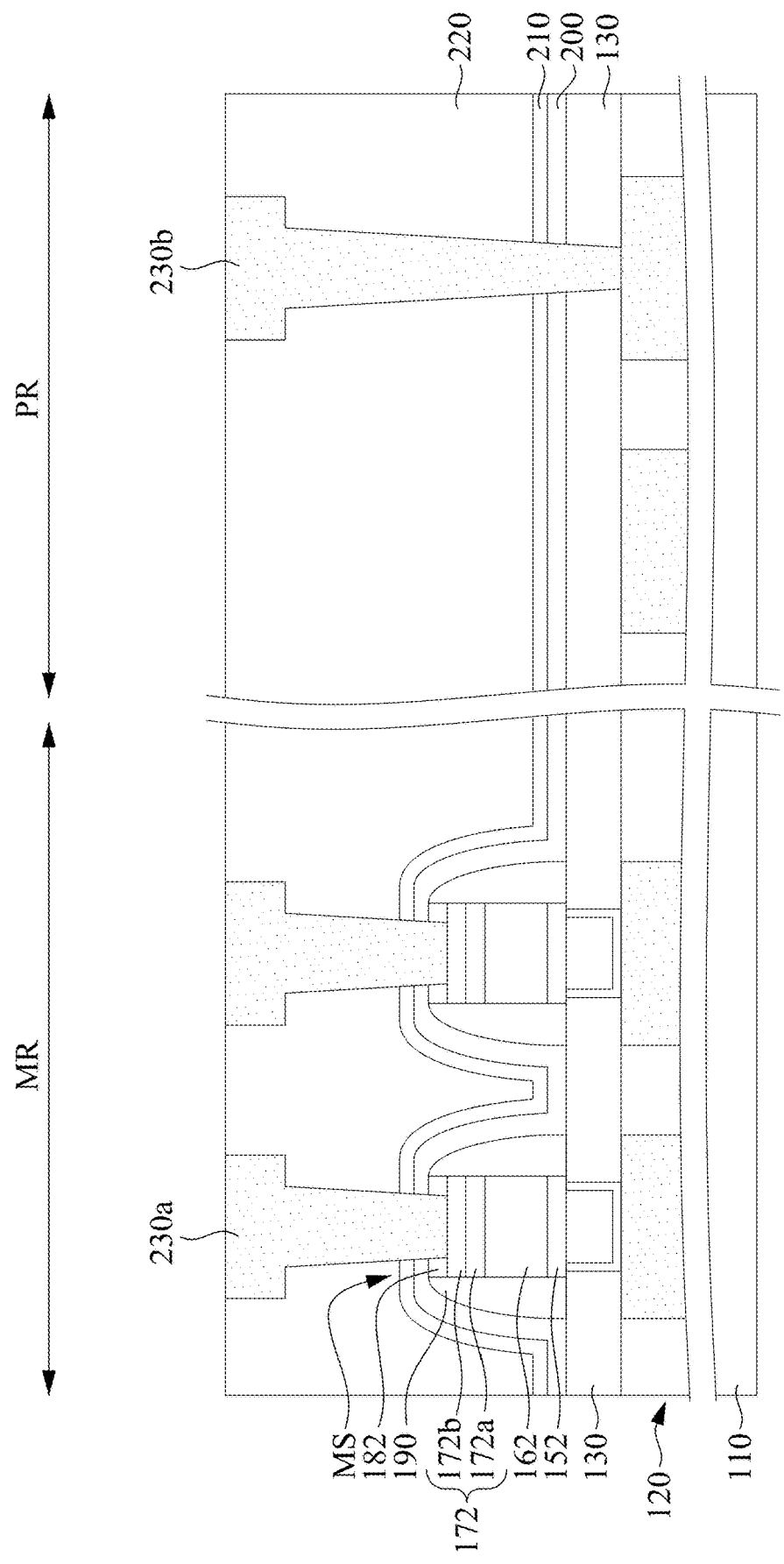
FIG. 17 is a cross-sectional view of an integrated circuit device in accordance with some embodiments of the present disclosure.

FIG. 17 is a cross-sectional view of an integrated circuit device in accordance with some embodiments of the present disclosure. The present embodiments are similar to those illustrated with respect to the embodiments of FIGS. 2-14, except that sidewalls of the hard masks 182, the top electrodes 172, the ferroelectric elements 162, and the bottom electrodes 152 are substantially aligned with each other. In the present embodiments, the top electrode layer 170, the ferroelectric layer 160, and the bottom electrode layer 150 (referring to FIG. 9) are respectively patterned into the top electrodes 172, the ferroelectric elements 162, and the bottom electrodes 152, using the hard masks 182 by suitable etching processes. Subsequently, spacers 190 are formed around the hard masks 182, the top electrodes 172, the ferroelectric elements 162, and the bottom electrodes 152. In the present embodiments, the top electrodes 172 may be a multi-layer structure. For example, the top electrodes 172 includes a first electrode layer 172a and a second electrode layer 172b over the first electrode layer 172a. Other details of the present embodiments are similar to those illustrated in the previous embodiments, and therefore not repeated herein.

Figure 18:
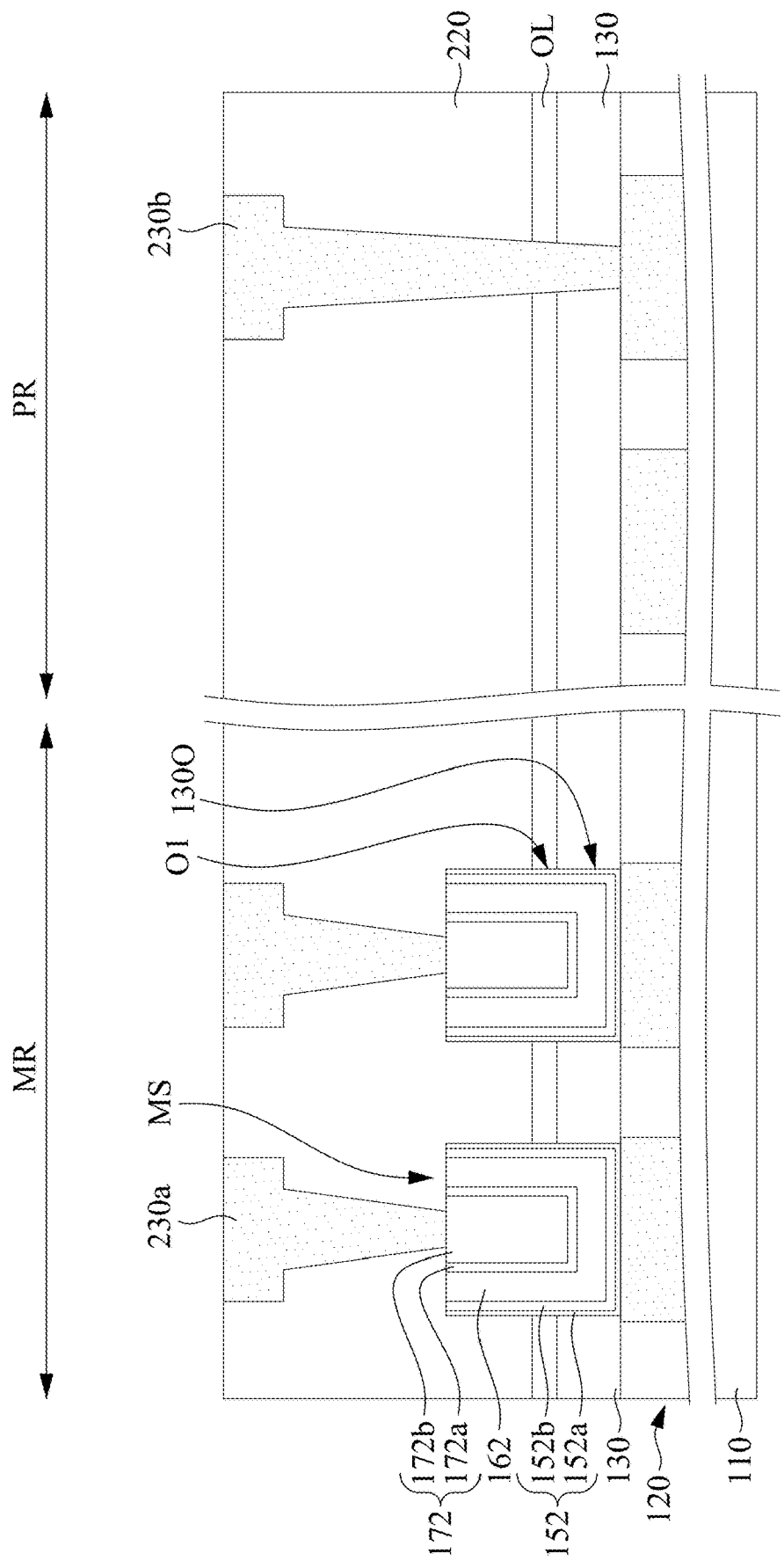
FIG. 18 is a cross-sectional view of an integrated circuit device in accordance with some embodiments of the present disclosure.

FIG. 18 is a cross-sectional view of an integrated circuit device in accordance with some embodiments of the present disclosure. The present embodiments are similar to those illustrated with respect to the embodiments of FIGS. 2-14, except that the ferroelectric elements 162 are formed in recesses of the bottom electrodes 152, and the top electrodes 172 are formed in recesses of the ferroelectric elements 162.

In the present embodiments, an oxide layer L1 is deposited over the dielectric layer 130 after the formation of the dielectric layer 130 as illustrated in FIG. 3. The oxide layer L1 may be made of tetra-ethyl-ortho-silicate (TEOS) or other suitable dielectric materials, as examples. The oxide layer L1 may be deposited using a CVD, plasma enhanced CVD (PECVD), PVD, or other suitable technique. After the formation of the oxide layer L1, openings O1 may be etched in the oxide layer L1, and then openings 130O may be etched in the dielectric layer 130. Subsequently, in the present embodiments, the top electrode layer 170, the ferroelectric layer 160, and the bottom electrode layer 150 (referring to FIG. 9) are deposited in the opening O1 in the oxide layer L1 and the opening 130O in the dielectric layer 130. Then portions of the top electrode layer 170, the ferroelectric layer 160, and the bottom electrode layer 150 (referring to FIG. 9) out of the openings 130O and O1 are removed, thereby forming the memory structure MS in FIG.

18. The removal may include a planarization process, such as CMP. Through the processes, a top surface of the memory structure MS may be substantially flat, and the top surface of the memory structure MS may include top surfaces of the top electrodes 172, top surfaces of the ferroelectric elements 162, and top surfaces of the bottom electrodes 152. In some embodiments, the oxide layer L1 may be etched back, such that sidewalls of the memory structure MS may be exposed. For example, a top surface of the oxide layer L1 is lower than the top surface of the memory structure MS. Other details of the present embodiments are similar to those illustrated in previous embodiments, and therefore not repeated herein.

Figure 19:
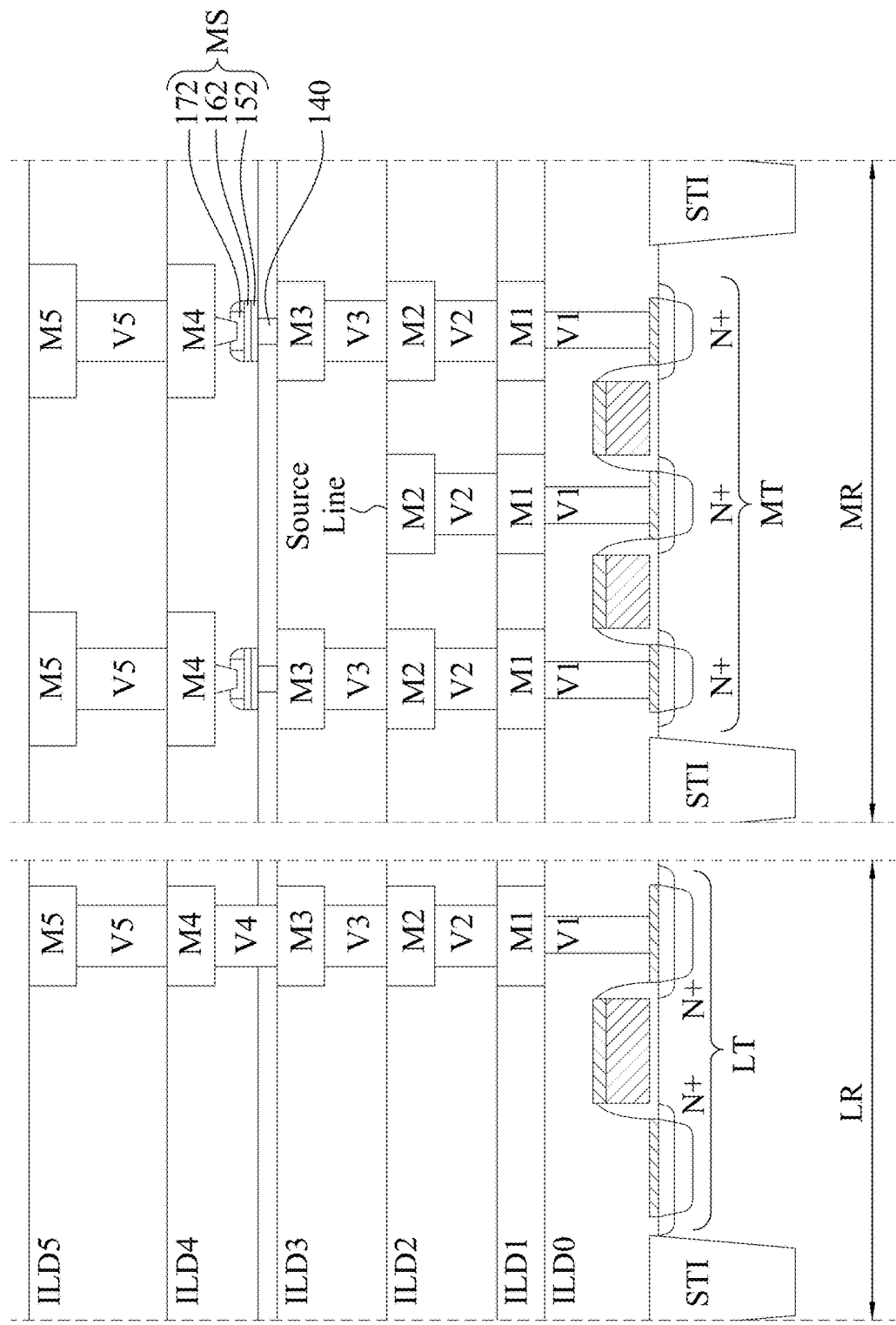
FIG. 19 is a cross-sectional view of an integrated circuit device in accordance with some embodiments of the present disclosure.

FIG. 19 is a cross-sectional view of an integrated circuit device 100 in accordance with some embodiments of the present disclosure. The integrated circuit device 100 is fabricated using five metallization layers, labeled as M1 through M5, with five layers of metallization vias or interconnects, labeled as V1 through V5. Other embodiments may contain more or fewer metallization layers and a corresponding more or fewer number of vias. The logic region LR includes a full metallization stack, including a portion of each of metallization layers M1-M5 connected by interconnects V2-V5, with V1 connecting the stack to a source/drain contact of the logic transistor LT. The memory region MR includes a full metallization stack connecting the memory cells (i.e., the memory structures MS) to transistors MT in the memory region MR, and a partial metallization stack connecting a source line to the transistors MT in the memory region MR. The memory structures MS are depicted as being fabricated in between the M3 layer and the M4 layer. The bottom electrode 152 is electrically connected with the metallization layer M3 through a BEVA 140. In some embodiments, a top electrode via 232a may be formed between the M4 layer and the top electrode 172 of the memory structure MS, and the top electrode 172 is electrically connected with the metallization layer M4 through the top electrode via 232a. Also included in integrated circuit is a plurality of ILD layers. Six ILD layers, identified as ILD0 through ILD5 are depicted in FIG. 19 as spanning the logic region LR and the memory region MR. The ILD layers may provide electrical insulation as well as structural support for the various features of the integrated circuit during many fabrication process steps.

Plural heat annealing processes may be performed to diffuse ions from the ILD layers (e.g., ILD0 through ILD5) after depositing the ILD layers (e.g., ILD0 through ILD5). In some embodiments, after the formation of the memory structures MS, these heat annealing processes are performed, and these heat annealing processes may contribute to the recrystallization of the ferro phase in the ferroelectric layer 160, and thereby increasing the ferro phase. For example, after the depositing of the ILD layer ILD4, prior to the depositing of the ILD layer ILD5, a heat annealing process may be performed to cure the ILD layer ILD4 and to diffuse ions away from the ILD layers ILD0-ILD4, and the heat annealing process may also result in phase transition and recrystallization in the ferroelectric layer 160. For example, after the depositing of the ILD layer ILD5, a heat annealing process may be performed to cure the ILD layer ILD5 and to diffuse ions away from the ILD layers ILD0-ILD5, and the heat annealing process may also result in phase transition and recrystallization in the ferroelectric layer 160. As such, after the formation of the ILD layers and the heat annealing processes, a large area of ferro phase in the ferroelectric element 162 can be obtained in finished memory structures MS. For example, for more than 90% of the memory structures MS on the substrate, a percentage of ferro phase in the ferroelectric element 162 of a memory structure MS is in a range from about 40% to about 95%, for example, higher than 50%.

By increasing the area of ferro phase in the ferroelectric layer 160, the formed plural FeRAM cells have better uniformity of FeRAM remanent polarization (2Pr), better uniformity of leakage, and better uniformity of capacitance. Furthermore, the formed individual FeRAM cell may have large FeRAM 2Pr, low FeRAM leakage, better data retention, higher breakdown voltage, as illustrated below in FIGS. 20-23. Furthermore, a uniformity of a top surface of the top electrode 172 is improved since the underlying ferroelectric layer 160 have more uniform phases.

Figure 20:
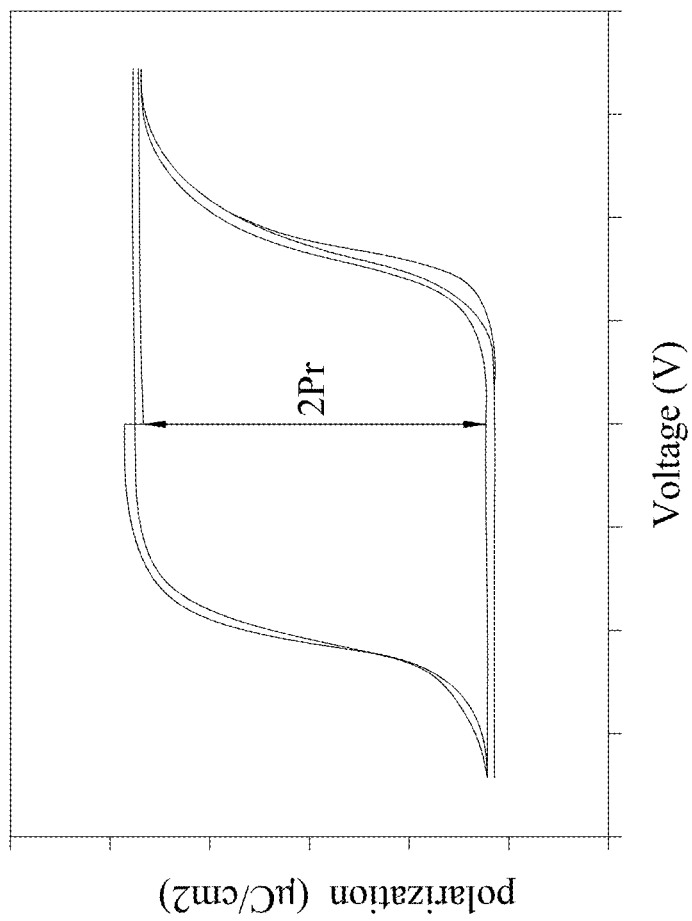
FIG. 20 is a graph illustrating experimental/simulation results showing a hysteresis loop of a memory cell according to some embodiments of the present disclosure.

FIG. 20 is a graph illustrating experimental/simulation results showing a hysteresis loop of a memory cell according to some embodiments of the present disclosure, wherein the polarization ($\mu C/cm^2$) is shown on the vertical axis in FIG. 20, and the voltage applied across the ferroelectric layer 160 (e.g., applied on the bottom electrode 152 or the top electrode 172 in FIG. 14) is shown on the horizontal axis in FIG. 20. The graph shows the hysteresis loop of the memory cell, in which its top electrode is deposited with low directionality as illustrated in FIG. 8. The values of remnant polarization (2Pr, $\mu C/cm^2$) can be extracted from the hysteresis curves of FIG. 20 at 0 volts on the horizontal axis. This graph shows that, by depositing the top electrode with low directionality as illustrated in FIG. 8, a large 2Pr in the ferroelectric layer can be obtained, which is beneficial for data retention. For example, compared to the cases where the top electrode deposited with high directionality, the 2Pr is increased by more than 30%.

Figure 21:
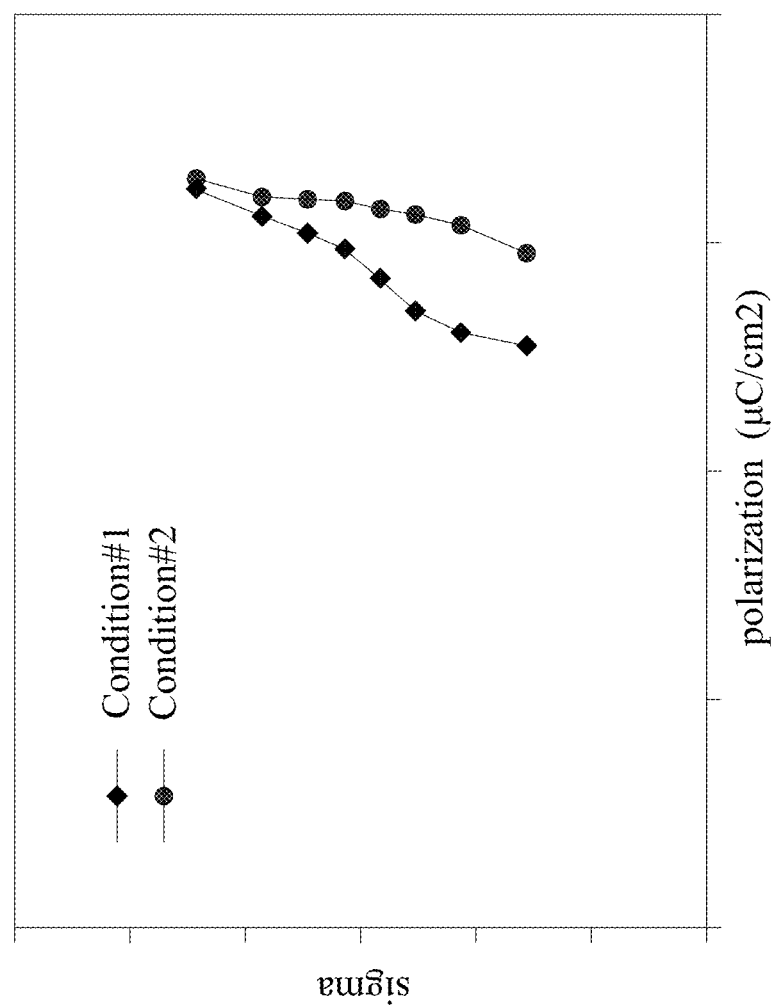
FIG. 21 is a graph illustrating experimental/simulation results showing polarization uniformity in different memory cells according to some embodiments of the present disclosure.

FIG. 21 is a graph illustrating experimental/simulation results showing polarization uniformity in different memory cells according to some embodiments of the present disclosure, wherein the remanent polarization (2Pr, $\mu C/cm^2$) is shown on the horizontal axis in FIG. 21, and the deviation from mean (sigma) or cumulative plot is shown on the vertical axis in FIG. 21. In Condition #1, the top electrodes of the memory cells are deposited by the PVD process with high directionality substantially normal to the substrate. In Condition #2, the top electrodes of the memory cells are deposited by the PVD process with low directionality substantially normal to the substrate as illustrated in FIG. 8.

In Condition #1, among plural memory cells, a difference between a smallest 2Pr and a largest 2Pr is quite large. This proves that the formed memory cells have the non-uniform hysteresis loops and non-uniform values of 2Pr.

Comparing Condition #2 with Condition #1, among plural memory cells, a difference between a smallest 2Pr and a largest 2Pr is reduced. This graph shows that, by depositing the top electrode with low directionality as illustrated in FIG. 8, the formed memory cells have more uniform hysteresis loops and more uniform values of 2Pr.

Figure 22:
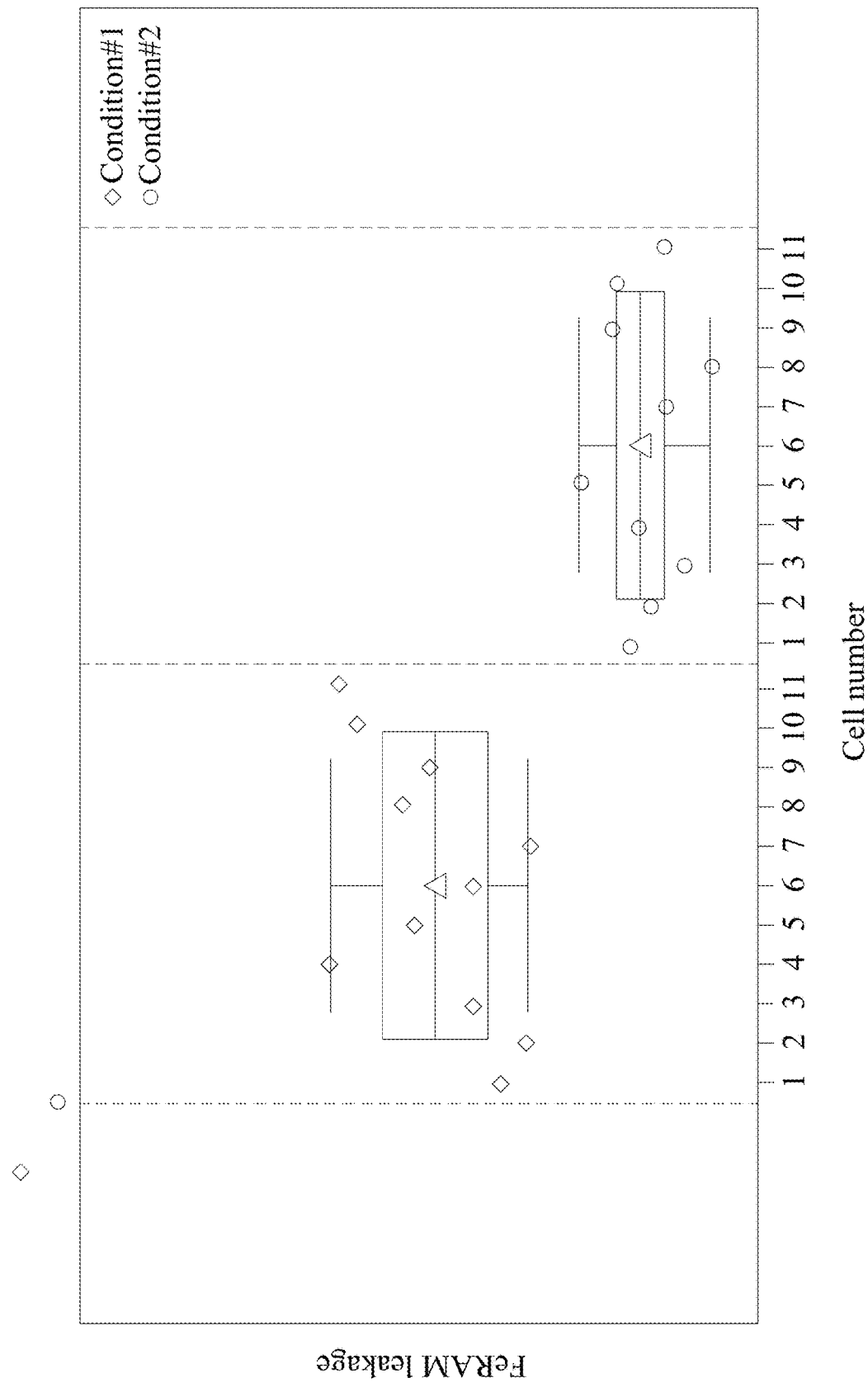
FIG. 22 is a graph illustrating experimental/simulation results showing leakages in different memory cells according to some embodiments of the present disclosure.

FIG. 22 is a graph illustrating experimental/simulation results showing leakages in different memory cells according to some embodiments of the present disclosure, wherein the FeRAM leakage current is shown on the vertical axis in FIG. 22, and the cell number is shown on the horizontal axis in FIG. 22. In Condition #1, the top electrodes of the memory cells are deposited by the PVD process with high directionality substantially normal to the substrate. In Condition #2, the top electrodes of the memory cells are deposited by the PVD process with low directionality substantially normal to the substrate as illustrated in FIG. 8.

In Condition #1, the formed memory cells have large values of leakage and a large deviation in the values of leakage. Comparing Condition #2 with Condition #1, the values of leakage in the formed memory cells are decreased, and a deviation in the values of leakage is also decreased. This graph shows that, by depositing the top electrodes with low directionality as illustrated in FIG. 8, the formed memory cells have lower leakage, which is beneficial for data retention. For example, herein, the leakage is reduced by more than 30%. Also, the uniformity of the leakage is improved.

FIG. 23 is a graph illustrating experimental/simulation results showing phases in ferroelectric layers in different memory cells according to some embodiments of the present disclosure. For example, experimental results can be obtained by the electron backscatter diffraction (EBSD). The exemplary ferroelectric layers are HZO herein. In Condition #1, the top electrode of the memory cell is deposited by the PVD process with high directionality substantially normal to the substrate. In Condition #2, the top electrode of the memory cell is deposited by the PVD process with low directionality substantially normal to the substrate as illustrated in FIG. 8.

In Condition #1, as the graph shows, non-ferro phases (i.e., the monoclinic-phase and the tetra-phase) may occupy a large area in the HZO. In Condition #1, a ratio of an area of the ferro phase (i.e., the orthorhombic-phase) to the entire cell area is in a range from about 20% to about 40%. The entire cell area may substantially equal to a combination of an area of ferro phase (i.e., the orthorhombic-phase), areas of non-ferro phases (i.e., the monoclinic-phase and the tetra-phase), and other areas in the HZO (i.e., those free of hatch patterns).

Comparing Condition #2 with Condition #1, the area occupied by the non-ferro phases (i.e., the monoclinic-phase and the tetra-phase) shrinks. In Condition #2, the ratio of the area of the ferro phase (i.e., the orthorhombic-phase) to the entire cell area is increased to be in a range from about 40% to about 95%, for example, greater than 50%. This graph shows that, by depositing the top electrode of the memory cell with low directionality, the small-sized FeRAM cell can have more area in the ferro phase that demonstrates its ferroelectric behavior.

According to the aforementioned embodiments, it can be seen that the present disclosure offers advantages in fabricating semiconductor devices. It is understood, however, that other embodiments may offer additional advantages, and not all advantages are necessarily disclosed herein. An advantage is that the top electrode is deposited using I-PVD process with a low directionality, such that the underlying ferroelectric layer have more area in the ferro phase that demonstrates the ferroelectric behavior after recrystallization, which enlarges the memory window. Therefore, the yield rate of small-sized FeRAM cells is improved. Another advantage is that a ratio of the ferro phase (e.g., a ratio of an area of ferro phase to a combination of areas of ferro and non-ferro phases) is in a range from about 40% to about 95% in the final FeRAM cell. By increasing the area of ferro phase in the ferroelectric layer, the formed FeRAM cell has better uniformities of FeRAM polarization (2Pr), leakage, and capacitance, large FeRAM 2Pr, low FeRAM leakage, better data retention, higher breakdown voltage. Furthermore, uniformity of the top electrode is improved. The phases in the ferroelectric layer 160 can be observed by XRD, EBSD, PED, and ratio of the ferro phase in the ferroelectric layer 160 can be obtained by EBSD and PED.

According to some embodiments of the present disclosure, a method for fabricating a semiconductor device is provided. The method includes depositing a ferroelectric layer over a substrate; performing a first ionized physical deposition process to deposit a top electrode layer over the ferroelectric layer; patterning the top electrode layer into a top electrode; and patterning the ferroelectric layer to into a ferroelectric element below the top electrode.

According to some embodiments of the present disclosure, a method for fabricating a semiconductor device is provided. The method includes forming an interconnect layer over a substrate; depositing a bottom electrode layer over the interconnect layer; depositing a ferroelectric layer over the bottom electrode layer; performing an ionized physical deposition process to deposit a top electrode layer over the ferroelectric layer; patterning the top electrode layer into at least one top electrode; patterning the ferroelectric layer and the bottom electrode layer respectively into at least one ferroelectric element and at least bottom electrode to form a memory cell, wherein the memory cell comprises the top electrode, the ferroelectric element, and the bottom electrode; depositing a first interlayer dielectric layer around the memory cell; and annealing the first interlayer dielectric layer and the memory cell, such that a ratio of a ferro phase in the ferroelectric element is in a range from 40% to 95%.

According to some embodiments of the present disclosure, a semiconductor device includes a substrate, a bottom electrode, a ferroelectric element, and a top electrode. The bottom electrode is over the substrate. The ferroelectric element is over the bottom electrode. A ratio of a ferro phase in the ferroelectric element is in a range from 40% to 95%. The top electrode is over the ferroelectric element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
depositing a ferroelectric layer over a substrate;
performing a first ionized physical deposition process to deposit a top electrode layer over and in contact with the ferroelectric layer, wherein the first ionized physical deposition process is performed with an AC bias in a range from about 0 W to about 50 W, and the AC bias does not exceed 50 W to prevent a ratio of non-ferro phase in the ferroelectric layer from increasing, wherein the ferroelectric layer is exposed to ionized metal atoms during the first ionized physical deposition process;
patterning the top electrode layer into a top electrode; and
patterning the ferroelectric layer into a ferroelectric element below the top electrode.

2. The method of claim 1, wherein the first ionized physical deposition process is performed using a DC power in a range from about 2000 W to about 7000 W.

3. The method of claim 1, further comprising:
depositing a conductive material over the substrate by performing a second ionized physical deposition process, wherein the second ionized physical deposition process is performed with a higher degree of directionality substantially normal to the substrate than that of the first ionized physical deposition process.

4. The method of claim 3, wherein the conductive material is deposited to form a bottom electrode layer over the substrate, and depositing the ferroelectric layer is performed such that the ferroelectric layer is over the bottom electrode layer.

5. The method of claim 3, further comprising:
forming a dielectric layer over the substrate; and
etching an opening in the dielectric layer, wherein the conductive material is deposited into the opening to form a bottom electrode via in the opening, and depositing the ferroelectric layer is performed such that the ferroelectric layer is over the bottom electrode via.

6. The method of claim 3, further comprising:
forming an interlayer dielectric layer over the substrate prior to depositing the ferroelectric layer or after patterning the top electrode layer and the ferroelectric layer; and
etching an opening in the interlayer dielectric layer, wherein the conductive material is deposited into the opening to form a conductive feature in the opening.

7. The method of claim 3, wherein the second ionized physical deposition process is performed using a greater DC power than that of the first ionized physical deposition process.

8. The method of claim 3, wherein the second ionized physical deposition process is performed using a greater gas flow than that of the first ionized physical deposition process.

9. The method of claim 3, wherein the second ionized physical deposition process is performed using a greater AC bias than the AC bias of the first ionized physical deposition process.

10. The method of claim 3, wherein the second ionized physical deposition process is performed using a greater DC/RF coil power than that of the first ionized physical deposition process.

11. A method for fabricating a semiconductor device, comprising:
forming an interconnect layer over a substrate;
performing a first ionized physical deposition process to deposit a bottom electrode layer over the interconnect layer with a first AC bias;
depositing a ferroelectric layer over the bottom electrode layer;
performing a second ionized physical deposition process to deposit a top electrode layer over and in contact with the ferroelectric layer, wherein the second ionized physical deposition process is performed by exposing the ferroelectric layer to a metal-containing plasma with a second AC bias in a range from about 0 W to about 50 W, and the second AC bias does not exceed 50 W to prevent a ratio of non-ferro phase in the ferroelectric layer from increasing;
patterning the top electrode layer into a top electrode;
patterning the ferroelectric layer and the bottom electrode layer respectively into a ferroelectric element and a bottom electrode to form a memory cell, wherein the memory cell comprises the top electrode, the ferroelectric element, and the bottom electrode;
depositing a first interlayer dielectric layer around the memory cell; and
annealing the first interlayer dielectric layer and the memory cell, wherein after the annealing a ratio of a ferro phase in the ferroelectric element is greater than about 40%.

12. The method of claim 11, wherein annealing the first interlayer dielectric layer and the memory cell is performed such that the ratio of the ferro phase in the ferroelectric element is greater than a ratio of a non-ferro phase in the ferroelectric element.

13. The method of claim 11, wherein depositing the ferroelectric layer is performed such that the ferroelectric layer comprises HZO, and the ferro phase is orthorhombic-phase.

14. A method for fabricating a semiconductor device, comprising:
depositing a dielectric layer over a substrate;
etching an opening in the dielectric layer;
forming a bottom electrode via in the opening in the dielectric layer, wherein forming the bottom electrode via comprises:
performing a first ionized physical deposition process to deposit a conductive layer into the opening and over a top surface of the dielectric layer, wherein a top surface of the conductive layer has a recessed region over the opening in the dielectric layer; and
removing a portion of the conductive layer;
depositing a ferroelectric layer over the bottom electrode via, wherein a top surface of the ferroelectric layer is substantially flat;
performing a second ionized physical deposition process to deposit a top electrode layer over and in contact with the substantially flat top surface of the ferroelectric layer, wherein a top surface of the top electrode layer is substantially flat, wherein an AC bias of the second ionized physical deposition process is less than an AC bias of the first ionized physical deposition process, such that the second ionized physical deposition process is performed with a lower degree of directionality substantially normal to the substrate than that of the first ionized physical deposition process, wherein the AC bias of the second ionized physical deposition process is in a range from about 0 W to about 50 W, and the AC bias of the second ionized physical deposition process does not exceed 50 W to prevent a ratio of non-ferro phase in the ferroelectric layer from increasing; and
removing a first portion of the top electrode layer and a first portion of the ferroelectric layer to form a memory cell, wherein the memory cell comprises a second portion of the top electrode layer and a second portion of the ferroelectric layer.

15. The method of claim 14, wherein the second ionized physical deposition process is performed using a lower DC power than that of the first ionized physical deposition process.

16. The method of claim 1, wherein a top surface of the ferroelectric layer is substantially flat, and the first ionized physical deposition process is performed to deposit the top electrode layer over and in contact with the substantially flat top surface of the ferroelectric layer.

17. The method of claim 1, wherein the first ionized physical deposition process is performed to increase a ratio of a ferro phase in the ferroelectric layer.

18. The method of claim 14, wherein an etch rate to deposition rate ratio of the second ionized physical deposition process is less than an etch rate to deposition rate ratio of the first ionized physical deposition process.

19. The method of claim 1, wherein the first ionized physical deposition process is performed using a DC power in a range from about 2000 W to about 7000 W, using a gas flow in a range from about 30 sccm to about 50 sccm, and using a DC/RF coil power in a range from greater than 0 W to about 500 W.

20. The method of claim 1, further comprising:
etching an opening in a dielectric layer over a substrate; and
depositing a bottom electrode layer into the opening in the dielectric layer, wherein depositing the ferroelectric layer is performed such that the ferroelectric layer is deposited into a first recess in the bottom electrode layer, and the first ionized physical deposition process is performed such that the top electrode layer is deposited into a second recess in the ferroelectric layer.

* * * * *